United States Patent
Dagley et al.

(10) Patent No.: US 9,907,214 B2
(45) Date of Patent: Feb. 27, 2018

(54) SYSTEMS AND METHODS FOR AIR CONDITIONING A BUILDING USING AN ENERGY RECOVERY WHEEL

(71) Applicant: Johnson Controls Technology Company, Holland, MI (US)

(72) Inventors: James F. Dagley, Cleveland, OH (US); Jonathan D. West, York, PA (US); Christos A. Polyzois, Minneapolis, MN (US); Kevin Swank, Cleveland, OH (US)

(73) Assignee: Johnson Controls Technology Company, Auburn Hills, MI (US)

( * ) Notice: Subject to any disclaimer, the term of this patent is extended or adjusted under 35 U.S.C. 154(b) by 600 days.

(21) Appl. No.: 14/508,925

(22) Filed: Oct. 7, 2014

(65) Prior Publication Data
US 2015/0096714 A1 Apr. 9, 2015

Related U.S. Application Data

(60) Provisional application No. 61/888,433, filed on Oct. 8, 2013.

(51) Int. Cl.
*F24F 12/00* (2006.01)
*H05K 7/20* (2006.01)
*F25B 49/02* (2006.01)

(52) U.S. Cl.
CPC ....... *H05K 7/20836* (2013.01); *F24F 12/003* (2013.01); *F24F 12/006* (2013.01);
(Continued)

(58) Field of Classification Search
CPC .............. F24F 2203/104; H05K 7/206; H05K 7/20745; H05K 7/20754; H05K 7/20836
(Continued)

(56) References Cited

U.S. PATENT DOCUMENTS 4,594,860 A 6/1986 Coellner et al.
5,579,647 A 12/1996 Calton et al.
(Continued)

OTHER PUBLICATIONS

Sullivan, Analysis of the KyotoCooling Process, 2009.*
(Continued)

*Primary Examiner* — Justin Jonaitis
*Assistant Examiner* — Eric Ruppert
(74) *Attorney, Agent, or Firm* — Foley & Lardner LLP

(57) ABSTRACT

Systems and methods for air conditioning a building using an energy recovery wheel are provided. An exemplary system includes a rotatable energy recovery wheel configured to rotate successively through a recirculated air stream and a second air stream separate from the recirculated air stream, and a refrigeration circuit configured to circulate a refrigerant through a cooling coil arranged in the recirculated air stream and a condenser arranged in the second air stream. The refrigeration circuit includes a pressure sensor configured to measure a condensing head pressure. The system further includes one or more temperature sensors configured to measure a temperature of the recirculated air stream upstream of the energy recovery wheel and downstream of the energy recovery wheel, and a controller configured to operate the energy recovery wheel and the refrigeration circuit based on the condensing head pressure and the temperatures of the recirculated air stream.

20 Claims, 10 Drawing Sheets

(52) U.S. Cl.
CPC ........... *F24F 2203/10* (2013.01); *F25B 49/02* (2013.01); *F25B 2600/17* (2013.01); *F25B 2700/195* (2013.01); *Y02B 30/52* (2013.01); *Y02B 30/563* (2013.01)

(58) Field of Classification Search
USPC ........................................................ 165/8, 9
See application file for complete search history.

(56) References Cited

U.S. PATENT DOCUMENTS

| | | | |
|---|---|---|---|
| 5,649,428 A | 7/1997 | Calton et al. | |
| 6,199,389 B1* | 3/2001 | Maeda ................... | F24F 3/1411 62/94 |
| 6,205,797 B1* | 3/2001 | Maeda ................... | F24F 3/1411 62/175 |
| 7,753,766 B2 | 7/2010 | Master et al. | |
| 7,886,986 B2 | 2/2011 | Fischer et al. | |
| 2005/0252229 A1 | 11/2005 | Moratalla | |
| 2005/0262862 A1 | 12/2005 | Moffitt | |

OTHER PUBLICATIONS

Sullivan, Introducing Using the Heat Wheel to Cool the Computer Room, 2009.*
Sullivan, Introducing the Heat Wheel to the Data Center, 2009.*
International Search Report and Written Opinion for Application PCT/US2014/059555, dated Jan. 23, 2015, 10 pages.
Mumma, Stanley A., "Dedicated Outdoor Air-Dual Wheel System Control Requirements", Ashrae Transactions, 2001 V. 107, 9 pages.

* cited by examiner

SYSTEMS AND METHODS FOR AIR CONDITIONING A BUILDING USING AN ENERGY RECOVERY WHEEL

CROSS-REFERENCE TO RELATED PATENT APPLICATIONS

This application claims the benefit of and priority to U.S. Application No. 61/888,433, filed Oct. 8, 2013, incorporated herein by reference in its entirety.

BACKGROUND

The present description relates generally to the field of heating, ventilation, and air conditioning (HVAC) systems. The present description relates more particularly to systems and methods for air conditioning a building using a rotatable energy recovery wheel. The present description relates more particularly still to systems and methods for cooling a data center using a rotatable energy recovery wheel.

An energy recovery wheel is a type of heat exchanger positioned within two separate air streams (e.g., supply and exhaust air streams of an air handling system) in order to transfer heat energy from one of the air streams to the other. Energy recovery wheels are often called thermal wheels, rotary heat exchangers, enthalpy wheels, or heat wheels. Typically, an energy recovery wheel is rotated such that a portion of the wheel moves successively between the two air streams. As the energy recovery wheel rotates, heat is absorbed into the wheel from the warmer of the two air streams (e.g., during a first half of the rotation) and rejected from the wheel to the cooler of the two air streams (e.g., during a second half of the rotation).

The heat transfer provided by an energy recovery wheel can be "sensible" heat transfer (i.e., an exchange of energy or enthalpy which results in a change in air temperature with no transfer of moisture between the two air streams), "latent" heat transfer (i.e., an exchange of energy or enthalpy which does not necessarily result in a change in air temperature and which transfers at least some moisture between the two air streams), or a combination of sensible heat transfer and latent heat transfer (i.e., an exchange of energy or enthalpy which results in both a change in air temperature and a transfer of moisture between the two air streams).

Typical buildings suitable for human occupancy (e.g., office buildings, residential buildings, etc.) generally require ventilation. Energy recovery wheels have traditionally been used with such buildings to extract the "energy" that was expended to condition the indoor air before it is exhausted to make room for the new "fresh" outside air. Data centers do not require ventilation and may actually be harmed by the humidity or pollution levels in the outside air. Energy recovery wheels can be used to provide indirect free cooling for a data center without introducing humidity or contaminants into the data center.

The change in air stream temperature resulting from the use of an energy recovery wheel may be proportional to the temperature difference between the two air streams (i.e., before the air streams pass through the energy recovery wheel) and may depend on the thermal efficiency of the energy recovery wheel. However, it is often difficult and challenging to predict the actual change in temperature resulting from the use of an energy recovery wheel because the actual heat transfer may be susceptible to various uncontrolled and/or unmeasured variables. Previous implementations of energy recovery wheels typically rely on a measurement of the air temperature outside the building to determine whether the change in temperature caused by the energy transfer wheel will be sufficient to cool the building to the desired temperature. However, such estimates can be inaccurate and lead to suboptimal system control and wasted energy.

SUMMARY

One implementation of the present disclosure is a system for air conditioning a building. The system includes a rotatable energy recovery wheel configured to rotate successively through a first air stream and a second air stream separate from the first air stream. Rotation of the energy recovery wheel may transfer heat between the first air stream and the second air stream. In some embodiments, at least one of the first air stream and the second air stream is a recirculated air stream. The system further includes a refrigeration circuit configured to circulate a refrigerant through a cooling coil arranged in the first air stream and a condenser arranged in the second air stream. In some embodiments, the refrigeration circuit includes a pressure sensor configured to measure a pressure of the refrigerant at the condenser. The system further includes one or more temperature sensors configured to measure a temperature of the recirculated air stream upstream of the energy recovery wheel and downstream of the energy recovery wheel and a controller configured to receive measurements from the pressure sensor and the one or more temperature sensors. The controller may be configured to operate the energy recovery wheel and the refrigeration circuit based on the measured pressure of the refrigerant at the condenser and the measured temperatures of the recirculated air stream.

In some embodiments, the recirculated air stream enters the system as a return air stream from the building and exits the system as a supply air stream to the building. In some embodiments, the system further includes a supply air temperature sensor configured to measure a temperature of the supply air stream. The controller may be configured to operate the energy recovery wheel and the refrigeration circuit to maintain the temperature of the supply air stream at a supply air temperature setpoint.

In some embodiments, the system further includes one or more devices for controlling a flow rate of the first air stream or the second air stream. The controller may be configured to modulate the flow rate of the first air stream or the second air stream using the one or more devices to maintain the temperature of the supply air stream at the supply air temperature setpoint.

In some embodiments, the controller is configured to operate the system in a first stage cooling mode in which the energy recovery wheel is active and the refrigeration circuit is inactive. In some embodiments, operating the system in the first stage cooling mode includes modulating a speed of rotation of the energy recovery wheel to maintain the temperature of the supply air stream at the supply air temperature setpoint. In some embodiments, the controller is configured to monitor a speed of rotation of the energy recovery wheel in the first stage cooling mode. The controller may be configured to transition from the first stage cooling mode to a second stage cooling mode in response to at least one of: the speed of rotation of the energy recovery wheel exceeding a threshold value for a predetermined period of time, and the temperature of the supply air stream exceeding the supply air temperature setpoint.

In some embodiments, the controller is configured to operate the system in a second stage cooling mode in which both the energy recovery wheel and the refrigeration circuit are active. Operating the system in the second stage cooling mode may include operating the refrigeration circuit to maintain the temperature of the supply air stream at the supply air temperature setpoint. In some embodiments, the controller is configured to cause the energy recovery wheel to rotate at a constant rotational speed in the second stage cooling mode. In some embodiments, the controller is configured to transition from the second stage cooling mode to the first stage cooling mode in response to at least one of: the temperature downstream of the energy recovery wheel being less than the temperature upstream of the energy recovery wheel, and the refrigeration circuit being not utilized for a predetermined period of time.

In some embodiments, the controller is configured to transition from the second stage cooling mode to a third stage cooling mode in response to at least one of: the temperature downstream of the energy recovery wheel being greater than the temperature upstream of the energy recovery wheel, and the temperature of the supply air stream exceeding the supply air temperature setpoint. In some embodiments, the controller is configured to record a transition pressure of the refrigerant at the condenser upon a transition from the second stage cooling mode to the third stage cooling mode.

In some embodiments, the controller is configured to operate the system in a third stage cooling mode in which the energy recovery wheel is inactive and the refrigeration circuit is active. Operating the system in the third stage cooling mode may include operating the refrigeration circuit to maintain the temperature of the supply air stream at the supply air temperature setpoint. In some embodiments, the controller is configured to transition from the third stage cooling mode to the second stage cooling mode in response to the pressure of the refrigerant at the condenser dropping below the recorded transition pressure.

Another implementation of the present disclosure is a method for air conditioning a building. The method includes rotating an energy recovery wheel successively through a first air stream and a second air stream separate from the first air stream. In some embodiments, at least one of the first air stream and the second air stream is a recirculated air stream. The method further includes circulating a refrigerant through a cooling coil arranged in the first air stream and through a condenser arranged in the second air stream, measuring a pressure of the refrigerant at the condenser, measuring a temperature of the recirculated air stream upstream of the energy recovery wheel and downstream of the energy recovery wheel, and operating the energy recovery wheel and the refrigeration circuit based on the measured pressure of the refrigerant at the condenser and the measured temperatures of the recirculated air stream.

In some embodiments, the method further includes receiving the recirculated air stream as a return air stream from the building, delivering the recirculated air stream as a supply air stream to the building, measuring a temperature of the supply air stream, and operating the energy recovery wheel and the refrigeration circuit to maintain the temperature of the supply air stream at a supply air temperature setpoint.

In some embodiments, the method further includes operating the energy recovery wheel and the refrigeration circuit in a first stage cooling mode in which the energy recovery wheel is active and the refrigeration circuit is inactive. Operating in the first stage cooling mode may include modulating a speed of rotation of the energy recovery wheel to maintain the temperature of the supply air stream at the supply air temperature setpoint. In some embodiments, the method further includes modulating a flow rate of the first air stream or the second air stream to maintain the temperature of the supply air stream at the supply air temperature setpoint. In some embodiments, the method further includes monitoring a speed of rotation of the energy recovery wheel in the first stage cooling mode and transitioning from the first stage cooling mode to a second stage cooling mode in response to at least one of: the speed of rotation of the energy recovery wheel exceeding a threshold value for a predetermined period of time, and the temperature of the supply air stream exceeding the supply air temperature setpoint.

In some embodiments, the method further includes operating the energy recovery wheel and the refrigeration circuit in a second stage cooling mode in which both the energy recovery wheel and the refrigeration circuit are active. Operating the energy recovery wheel and the refrigeration circuit in the second stage cooling mode may include operating the refrigeration circuit to maintain the temperature of the supply air stream at the supply air temperature setpoint. In some embodiments, the method further includes transitioning from the second stage cooling mode to the first stage cooling mode in response to at least one of: the temperature downstream of the energy recovery wheel being less than the temperature upstream of the energy recovery wheel, and the refrigeration circuit being not utilized for a predetermined period of time.

In some embodiments, the method further includes transitioning from the second stage cooling mode to a third stage cooling mode in response to at least one of: the temperature downstream of the energy recovery wheel being greater than the temperature upstream of the energy recovery wheel, and the temperature of the supply air stream exceeding the supply air temperature setpoint. In some embodiments, the method further includes recording a transition pressure of the refrigerant at the condenser upon a transition from the second stage cooling mode to the third stage cooling mode.

In some embodiments, the method further includes operating the energy recovery wheel and the refrigeration circuit in a third stage cooling mode in which the energy recovery wheel is inactive and the refrigeration circuit is active. Operating the energy recovery wheel and the refrigeration circuit in the third stage cooling mode may include operating the refrigeration circuit to maintain the temperature of the supply air stream at the supply air temperature setpoint. In some embodiments, the method further includes transitioning from the third stage cooling mode to the second stage cooling mode in response to the pressure of the refrigerant at the condenser dropping below the recorded transition pressure.

Another implementation of the present disclosure is a system for air conditioning a building. The system includes a flow control unit including a first fluid channel having a first fluid inlet and a first fluid outlet, a second fluid channel having a second fluid inlet and a second fluid outlet, and one or more flow control devices configured to transition the flow control unit between a recirculation mode and a ventilation mode. In the recirculation mode, the first fluid inlet may be fluidly connected with the first fluid outlet and the second fluid inlet may be fluidly connected with the second fluid outlet. In the ventilation mode, the first fluid inlet may be fluidly connected with the second fluid outlet and the second fluid inlet may be fluidly connected with the first fluid outlet. The system further includes a rotatable energy recovery wheel configured to rotate successively through the first fluid channel and the second fluid channel and a refrigeration circuit configured to circulate a refrigerant through a cooling coil arranged in the first fluid channel and through a condenser arranged in the second fluid channel. The system further includes one or more sensors configured to measure a return air temperature at the first fluid inlet, a supply air temperature at the first fluid outlet, a ventilation air temperature at the second fluid inlet, and a ventilation air humidity at the second fluid inlet. The system further includes a controller configured to receive measurements from the one or more sensors. The controller may be configured to operate the energy recovery wheel, the refrigeration circuit, and the flow control unit based on the received measurements.

Another implementation of the present disclosure is a method for air conditioning a building having an active cooling system and a passive cooling system. The method includes providing a passive cooling system configured to passively transfer heat from a first air stream to a second air stream separate from the first air stream, providing an active cooling system configured to actively transfer heat from the first air stream to the second air stream, without measuring a temperature of the second air stream, determining whether to utilize the passive cooling system to cool the first air stream, and controlling the passive cooling system based on a result of the determination.

In some embodiments, determining whether to utilize the passive cooling system to cool the first air stream includes measuring a load on the active cooling system. Controlling the passive cooling system based on a result of the determination may include activating the passive cooling system in response to a determination that the load on the active cooling system is less than a threshold value. In some embodiments, the threshold value is a previously-measured value of the load on the active cooling system. The previously-measured value may be measured during a transition from a cooling mode in which the passive cooling system is active to a cooling mode in which the passive cooling system is inactive.

In some embodiments, the active cooling system includes a refrigeration circuit configured to circulate a refrigerant through a condenser and measuring the load on the active cooling system includes measuring a pressure of the refrigerant at the condenser. In some embodiments, measuring the load on the active cooling system includes measuring at least one of: an amount of power consumed by the active cooling system, an amount of energy consumed by the active cooling system, and an amount of electric current drawn by the active cooling system.

In some embodiments, determining whether to utilize the passive cooling system to cool the first air stream includes measuring a temperature of the first air stream upstream of the passive cooling system and downstream of the passive cooling system. Controlling the passive cooling system based on a result of the determination may include deactivating the passive cooling system in response to a determination that the temperature measured upstream of the passive cooling system is lower than the temperature measured downstream of the passive cooling system.

In some embodiments, at least one of the first air stream and the second air stream is a recirculated air stream. In some embodiments, the passive cooling system is capable of transferring heat from the first air stream to the second air stream only when the first air stream has a temperature higher than the temperature of the second air stream.

The foregoing is a summary and thus by necessity contains simplifications, generalizations, and omissions of detail. Consequently, those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIG. 4A illustrates the flow paths with the energy recovery wheel active and FIG. 4B illustrates the flow paths with the energy recovery wheel inactive, according to an exemplary embodiment.

DETAILED DESCRIPTION

Figure 1:
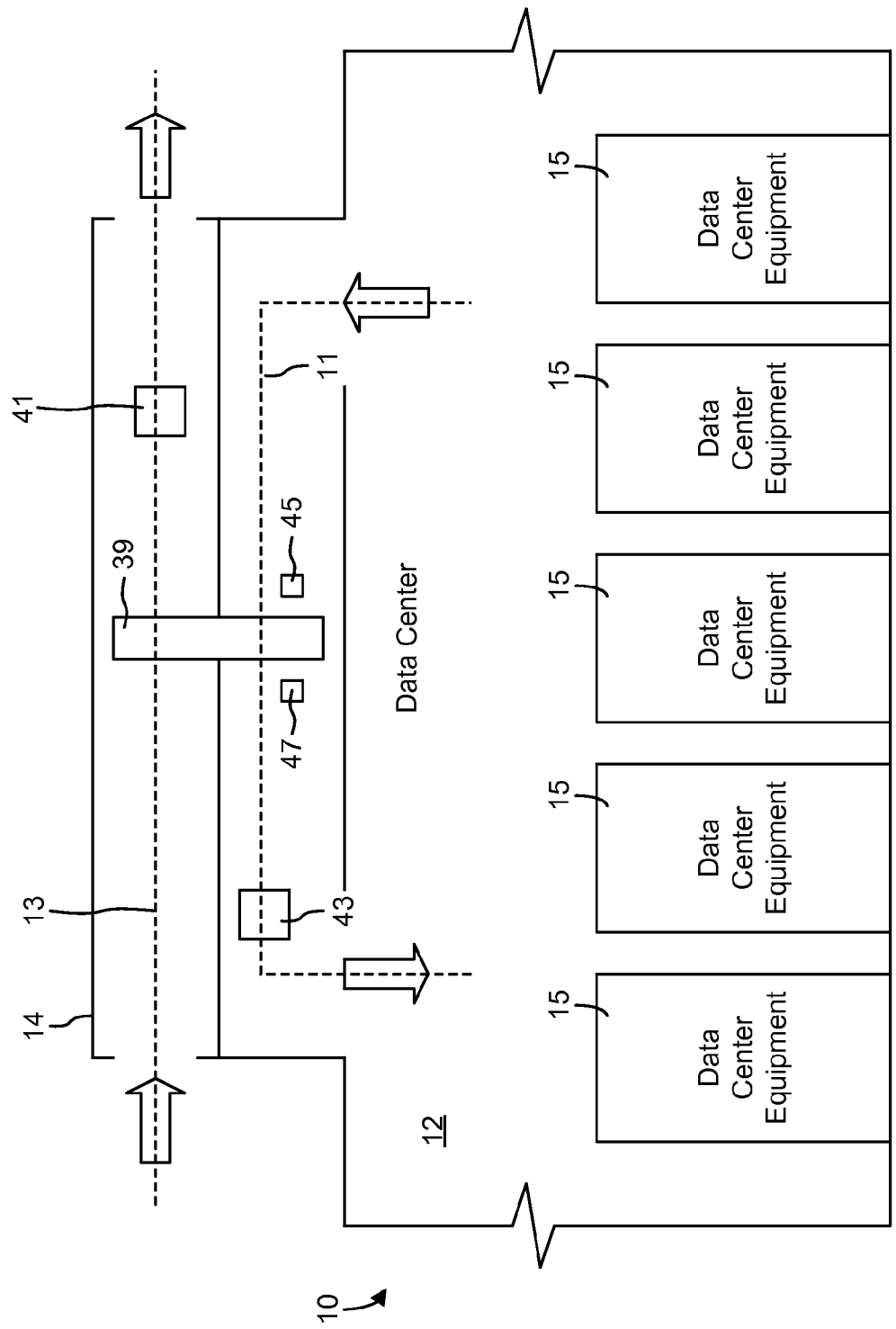
FIG. 1 is a drawing of a data center equipped with an air conditioning system for controlling one or more properties of an air stream delivered to an air conditioned space within the data center, according to an exemplary embodiment.

Referring generally to the FIGURES, systems and methods for air conditioning a building using an energy recovery wheel are shown, according to various exemplary embodiments. In some embodiments, the building is a data center. In other embodiments, the building may be any other type of building (e.g., an office building, a warehouse, a residential building, etc.). The systems and methods described herein may be used to provide efficient and reliable cooling for an air conditioned space through the use of a rotatable energy recovery wheel. The energy recovery wheel may be configured to rotate successively through a first air stream and a second air stream, thereby transferring heat energy (e.g., sensible heat energy, latent heat energy, etc.) between the two air streams. In some embodiments, the energy recovery wheel may be part of a heating, ventilation, and air conditioning (HVAC) system for the building. For example, the energy recovery wheel may be part of a rooftop air handling unit (AHU) for a building HVAC system.

In some implementations, the first air stream is a recirculated air stream (i.e., received from and delivered to a space within the building) and the second air stream is an external air stream (i.e., received from and delivered to a space outside the building). The energy recovery wheel may be used to provide substantially free cooling for the air conditioned space without introducing outdoor air into the building. The first and second air streams may be guided through the energy recovery wheel by a system of air ducts, fans, dampers, or other flow control devices.

Advantageously, the systems and methods described herein may be used to control operation of the energy recovery wheel without relying on a measurement of the external air temperature (e.g., a temperature outside the building, a temperature of the external air stream, etc.). The air conditioning system may include one or more temperature sensors configured to measure a temperature of the recirculated air stream upstream of the energy recovery wheel and downstream of the energy recovery wheel. The energy recovery wheel may be controlled (e.g., activated, deactivated, rotational speed modulated, etc.) based on the measured temperatures of the recirculated air stream.

In some embodiments, the air conditioning system includes a refrigeration circuit configured to circulate a refrigerant through a cooling coil arranged in the first air stream and a condenser arranged in the second air stream. In some embodiments, the air conditioning system may be operated in a first stage cooling mode in which the energy recovery wheel is active and the refrigeration circuit is inactive, a second stage cooling mode in which both the energy recovery wheel and the refrigeration circuit are active, and a third stage cooling mode in which the energy recovery wheel is inactive and the refrigeration circuit is active.

The air conditioning system may include a controller configured to operate the energy recovery wheel and the refrigeration circuit and to transition the system between the first stage cooling mode, the second stage cooling mode, and the third stage cooling mode. In some embodiments, the controller receives a measurement of the refrigerant head pressure at the condenser. The controller may be configured to operate the energy recovery wheel and the refrigeration circuit based on the measured pressure of the refrigerant at the condenser and the measured temperatures of the recirculated air stream.

Referring now to FIG. 1, a cross-sectional view of a data center 10 is shown, according to an exemplary embodiment. Data center 10 may be a facility (i.e., a building) used to house computer systems and other electronic components. Data center 10 is shown to include an air conditioned space 12 in which multiple racks of data center equipment 15 are contained. Data center equipment 15 may include computer systems and associated components such as computer servers, data storage devices, communications systems, processing devices, and/or other types of electronic devices. Data center equipment 15 may be contained in multiple racks, stacks, cases, or other devices configured to house a data center equipment 15. Data center equipment 15 may be heat-producing equipment and may require cooling in order to operate effectively. Air conditioned space 12 may be a space within data center 10 which is subject to air temperature control, air humidity control, air quality control, and/or any other type of air conditioning or control in order to maintain an environment in which data center equipment 15 can effectively operate. Air conditioned space 12 may include one or more features used to draw heat away from data center equipment 15 and into the air within air conditioned space 12 (e.g., elevated floors, fans, cold air and warm air containment isles, etc.).

Data center 10 is shown to include an air conditioning system 14. Air conditioning system 14 may be configured to receive a first air stream 11 from within air conditioned space 12 and a second air stream 13 from an area external to data center 10. First air stream 11 may be referred to as a recirculated air stream and second air stream 13 may be an outside air stream. Air conditioning system 14 delivers first air stream 11 back to air conditioned space 12 and exhausts second air stream 13 as exhaust air outside data center 10.

In some embodiments, air conditioning system 14 includes an air handling unit (AHU). For example, air conditioning system 14 may include one or more fans, blowers, chillers, dampers, filtration devices, or other components which may be used to control heating, ventilation, or air conditioning provided to air conditioned space 12. In some embodiments, air conditioning system 14 is a rooftop air handling unit. In other embodiments, air conditioning system 14 is located elsewhere coupled to or within data center 10 (e.g., in a basement, proximate to air conditioned space 12, etc.). In yet other embodiments, air conditioning system 14 is configured to cool spaces other than data centers or to cool equipment other than computing equipment.

Air conditioning system 14 is shown to include a passive cooling system 39. Passive cooling system 39 may include, for example, an energy recovery wheel, a heat pipe, a heat exchanger, and/or any other equipment or device configured to transfer heat from a relatively warmer medium to a relatively cooler medium. Passive cooling system 39 may utilize any type of passive cooling technology (e.g., refrigerant migration, geothermal cooling, capillary action refrigeration, nighttime coldness, etc.) and may require minimal or no energy to operate. Passive cooling system 39 may provide energy-efficient cooling for first air stream 11 (e.g., passive cooling, free cooling, etc.) and may be operated when conditions indicate that passive cooling may be used to remove heat from first air stream 11.

Air conditioning system 14 is shown to further include an active cooling system including a first active cooling system element 41 and a second active cooling system element 43. Active cooling system elements 41 and 43 may be part of an active cooling system (e.g., a vapor compression refrigeration system, a forced convection refrigeration system, etc.) configured to transfer heat from a relatively cooler medium to a relatively warmer medium and from a relatively warmer medium to a relatively cooler medium. In some embodiments, active cooling system elements 41 and 43 may be components of a refrigeration circuit configured to circulate a fluid refrigerant between first air stream 11 and second air stream 13. For example, active cooling system element 43 may be a cooling coil, an evaporator, or other active cooling device configured to absorb heat from first air stream 11. The heat absorbed by active cooling system element 43 may be transported to active cooling system element 41 (e.g., using a powered compressor, refrigerant pump, etc.) and rejected into second air stream 13.

The active cooling system may include one or more energy-consuming components (i.e., components which require an external energy source to effectuate heat transfer) and may be less energy efficient than passive cooling system 39 in cooling first air stream 11. However, the active cooling system may be capable of transferring heat both from a cooler medium to a warmer medium and from a warmer medium to a cooler medium. The active cooling system may be used when conditions indicate that passive cooling system 39 would be ineffective or counterproductive in cooling first air stream 11.

Advantageously, air conditioning system 14 may determine when passive cooling system 39 may be used to cool first air stream 11 without relying on a measurement of the external air temperature (e.g., outside data center 10). This functionality provides significant advantages over traditional economizer cooling systems which typically rely on a measurement of the air temperature outside the building to determine whether the change in temperature caused by the energy-efficient cooling system will be sufficient to cool the building to the desired temperature.

For example, air conditioning system 14 may include one or more temperature sensors 45 and 47 configured to measure a temperature of first air stream 11 upstream of passive cooling system 39 (i.e., at sensor 45) and downstream of passive cooling system 39 (i.e., at sensor 47). If the measured downstream temperature is less than the measured upstream temperature, air conditioning system 14 may determine that passive cooling system 39 may be operated to remove heat from first air stream 11. However, if the measured downstream temperature is greater than the measured upstream temperature, air conditioning system 14 may determine that operation of passive cooling system 39 is ineffective or counterproductive in cooling first air stream 11.

In some embodiments, air conditioning system 14 may be configured to monitor a load on the active cooling system in determining whether to utilize passive cooling system 39. The load on the active cooling system may be measured using a variety of techniques such as measuring an amount of energy, power, or electric current consumed by the active cooling system or measuring a refrigerant pressure at a condenser of the active cooling system. The refrigerant pressure at the condenser may be indicative of an amount of work performed by a compressor of the active cooling system and provides an effective measurement of the load on the active cooling system.

Figure 2:
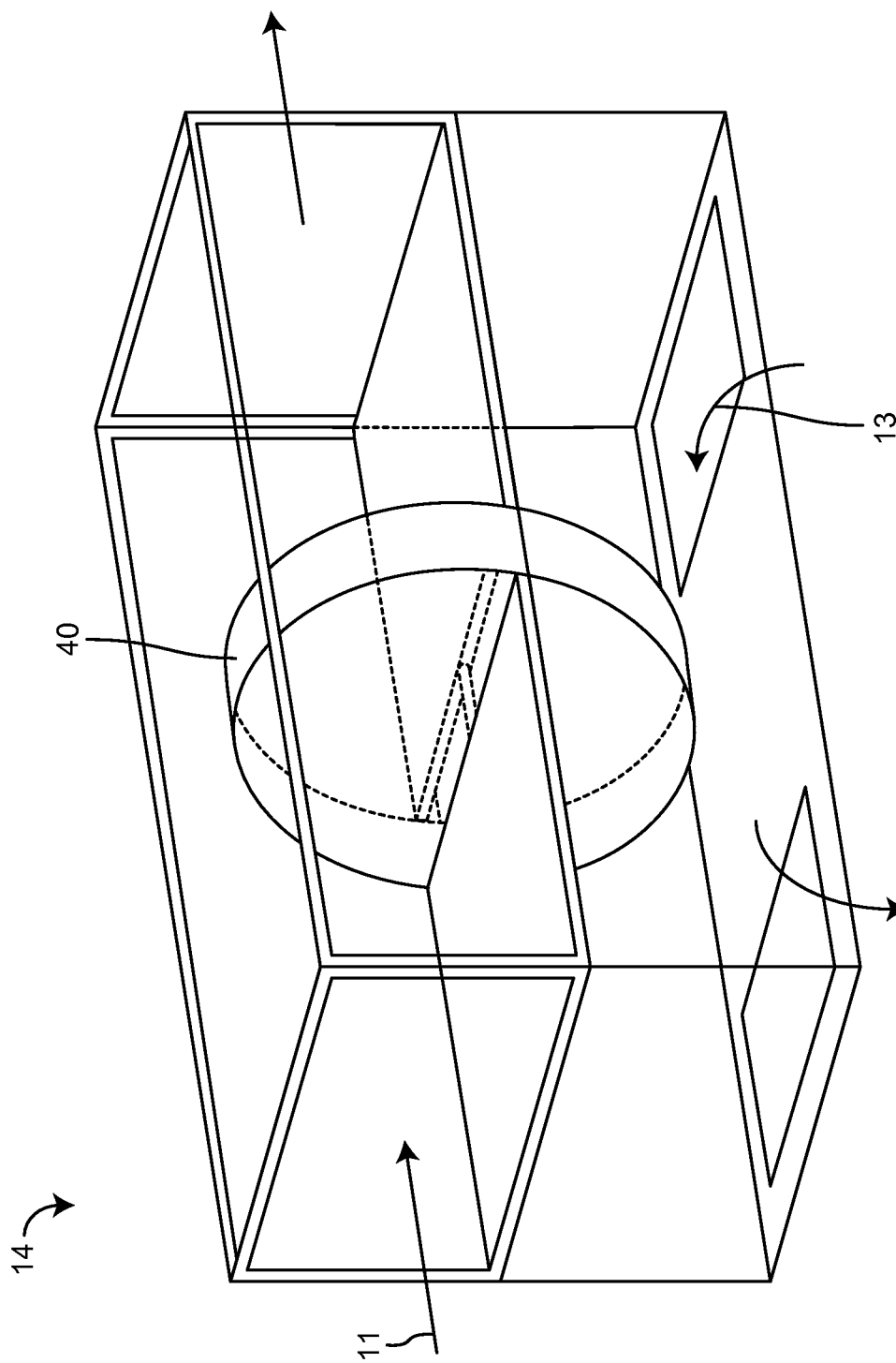
FIG. 2 is a drawing of a rotatable energy recovery wheel which may be contained within the air conditioning system of FIG. 1 and which may be used for transferring heat energy between a first air stream and a second air stream separate from the first air stream, according to an exemplary embodiment.

Referring now to FIG. 2, a perspective drawing of an energy recovery wheel 40 is shown, according to an exemplary embodiment. Energy recovery wheel 40 may be located within air conditioning system 14 and may be positioned in the flow paths of two separate air streams (e.g., first air stream 11 and second air stream 13). Energy recovery wheel 40 may be a thermal wheel, a rotary heat exchanger, an enthalpy wheel, or a heat wheel. Energy recovery wheel 40 may be rotatable about an axis of rotation substantially parallel to a flow direction of first air stream 11 and/or second air stream 13. Rotation of energy recovery wheel 40 may cause a portion of energy recovery wheel 40 to move successively through first air stream 11 and second air stream 13.

Energy recovery wheel 40 may be configured to transfer heat energy from one of air streams 11 and 13 to the other of air streams 11 and 13 based on which of air streams 11 and 13 has a higher temperature. For example, as energy recovery wheel 40 rotates, heat may be absorbed by energy recovery wheel 40 from the warmer of the two air streams (e.g., during a first half of the rotation) and rejected from energy recovery wheel 40 to the cooler of the two air streams (e.g., during a second half of the rotation). For implementations in which air conditioning system 14 is used to remove heat from air conditioned space 12, energy recovery wheel 40 may transfer heat from first stream 11 to second air stream 13. Energy recovery wheel 40 may be rotated (e.g., via an attached motor) at a plurality of rotational speeds. The rotational speed of energy recovery wheel 40 may be adjusted or controlled to increase or decrease the amount of heat transfer between first air stream 11 and second air stream 13.

Energy recovery wheel 40 may be configured to transfer sensible heat, latent heat, or a combination thereof. Sensible heat transfer may be defined as an exchange of energy or enthalpy which results in a change in air temperature with no transfer of moisture between the two air streams. Latent heat transfer may be defined as an exchange of energy or enthalpy which does not necessarily result in a change in air temperature and which transfers at least some moisture between the two air streams. A combination of sensible heat transfer and latent heat transfer may be defined as an exchange of energy or enthalpy which results in both a change in air temperature and a transfer of moisture between the two air streams.

In some embodiments, energy recovery wheel 40 is a porous disk having a plurality of fluid flow paths (e.g., pores, channels, etc.) extending through the disk parallel to the axis of rotation. In some embodiments, energy recovery wheel 40 includes a sorptive material (i.e., an absorptive and/or desorptive material) configured to collect heat and/or moisture from one of the air streams and deliver the heat and/or moisture to the other of the air streams. In some embodiments, the geometry or material selection of energy recovery wheel 40 may be configured to optimize the transfer of heat and/or moisture between air streams (e.g., by maximizing the surface area of energy recovery wheel 40, by using thermally conductive materials, etc.). U.S. Pat. Nos. 4,594,860 and 5,649,428 disclose several examples of rotatable heat transfer and moisture transfer wheels.

Figure 3:
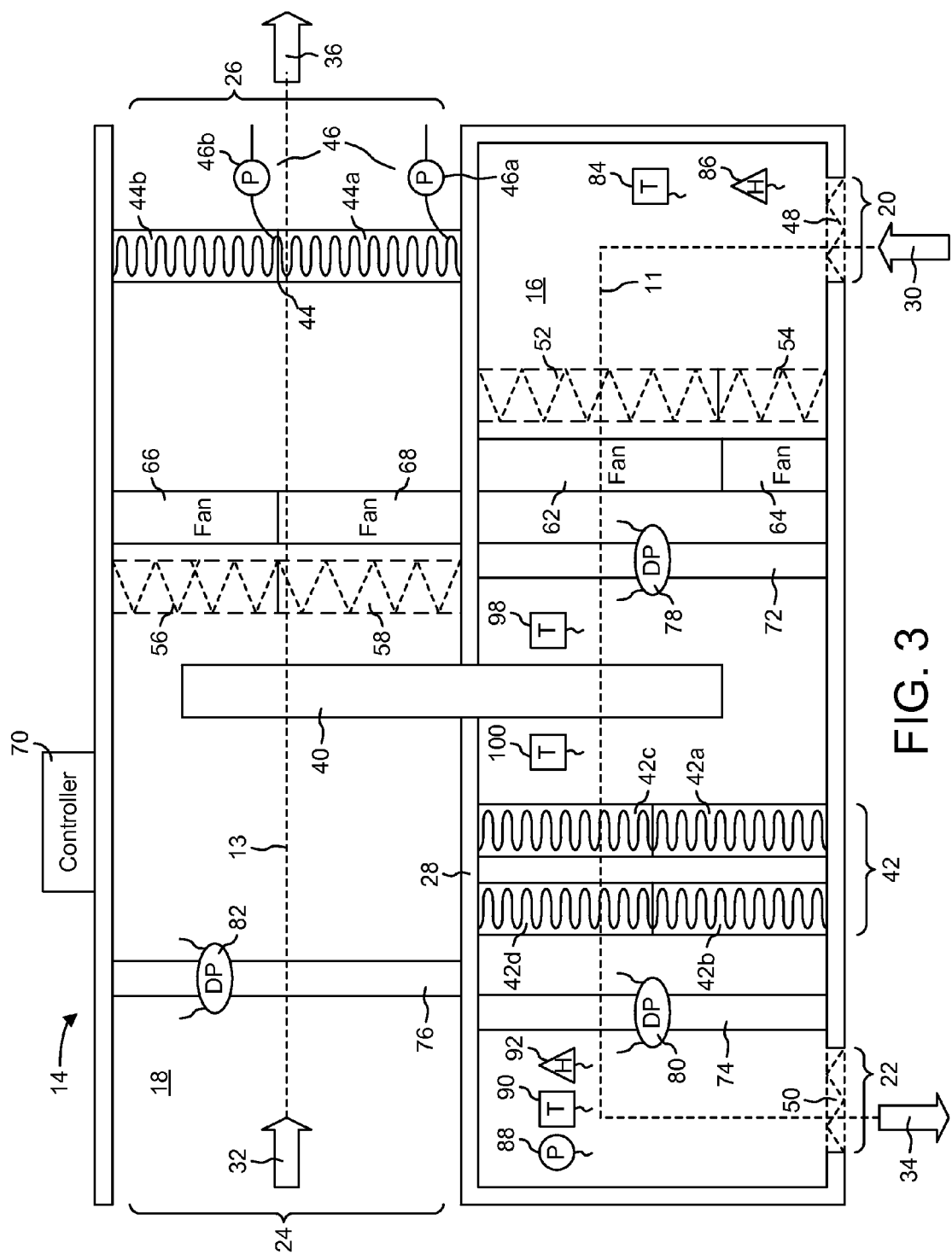
FIG. 3 is a cross-sectional drawing of the air conditioning system of FIG. 1, showing the rotatable energy recovery wheel contained therein and illustrating a cooling coil arranged in the first air stream and a condenser arranged in the second air stream, the cooling coil and the condenser being part of a refrigeration circuit, according to an exemplary embodiment.

Referring now to FIG. 3, a cross-sectional drawing illustrating air conditioning system 14 in greater detail is shown, according to an exemplary embodiment. Air conditioning system 14 is shown to include a first fluid channel 16 and a second fluid channel 18. Fluid channels 16 and 18 may be substantially parallel channels and may be physically separated (e.g., by a dividing wall 28) such that substantially no leakage occurs between fluid channels. Fluid channel 16 is shown to include a first inlet 20 and a first outlet 22. Second fluid channel 18 is shown to include a second inlet 24 and a second outlet 26. As shown, first inlet 20 and second inlet 24 may be located at opposite ends of air conditioning system 14 such that first air stream 11 and second air stream 13 enter opposite ends of air conditioning system 14 and travel through air conditioning system 14 in a cross-flow orientation (i.e., in opposite directions).

First fluid channel 16 may be configured to receive first air stream 11 via inlet 20 and guide first air stream 11 through air conditioning system 14 toward outlet 22. In the system shown, first air stream 11 is a recirculated air stream received from air conditioned space 12 within data center 10. First air stream 11 may be received from data center 10 as return air 30 (i.e., returning to air conditioning system 14 from data center 10) and may be delivered to data center 10 as supply air 34 (i.e., supplied by air conditioning system 14 to data center 10). As shown in FIG. 3, return air 30 and supply air 34 may both be components of first air stream 11.

Second fluid channel 18 may be configured to receive second air stream 13 via inlet 24 and guide second air stream 13 through air conditioning system 14 toward outlet 26. Second air stream 13 may be received via inlet 24 as outside air 32 and may be exhausted via outlet 26 as exhaust air 36. As shown in FIG. 3, outside air 32 and exhaust air 36 are both components of second air stream 13. In some embodiments, first air stream 11 and second air stream 13 may be maintained as separate air streams within air conditioning system 14 (i.e., without mixing). In one or more alternative embodiments, some amount of mixing may occur.

Still referring to FIG. 3, air conditioning system 14 is shown to include several control devices including an energy recovery wheel 40, a cooling coil 42, a condenser 44, dampers 48-58, and fans 62-68. Air conditioning system 14 is also shown to include a variety of sensory devices including pressure sensors 46, 78-82 and 88, temperature sensors 84, 90, 98, and 100, and humidity sensors 86 and 92. The control devices may be configured to affect a state or condition of the first and second air streams (e.g., temperature, humidity, pressure, flow rate, etc.) and the sensory devices may be configured to measure a state or condition of the first and second air streams.

Some or all of the control devices and sensory devices may communicate with a controller 70. Controller 70 may receive input signals from the sensory devices and send control signals to the control devices. For example, controller 70 may be configured to operate energy recovery wheel 40 (e.g., a motor driving energy recovery wheel 40) and cooling coil 42 based on the temperature of supply air 34 (e.g., measured by temperature sensor 90) and the temperature differential across energy recovery wheel 40 (e.g., measured by temperature sensors 98 and 100). Controller 70 is described in greater detail with reference to FIG. 6.

Still referring to FIG. 3, air conditioning system 14 is shown to include energy recovery wheel 40 and a cooling coil 42. In some embodiments, cooling coil 42 is located within or along first fluid channel 16 to provide cooling for first air stream 11 (as shown in FIG. 3). First air stream 11 may pass through or over cooling coil 42 while travelling through first fluid channel 16. In other embodiments, cooling coil 42 may be located within or along second fluid channel 18 to provide cooling for second air stream 13. In further embodiments, multiple cooling coils 42 may be used (e.g., in both first fluid channel 16 and second fluid channel 18) to provide cooling for either or both of first air stream 11 and second air stream 13.

In some embodiments, cooling coil 42 includes a plurality of sections (i.e., sections 42a, 42b, 42c, and 42d) which may be activated or deactivated independently to adjust an amount of cooling provided. In some embodiments, sections 42a-42d may be activated or deactivated using one or more electronic valves (under control of controller 70) to control a flow of refrigerant therethrough. Cooling coil 42 may be chilled to a temperature below the temperature of first air stream 11 in order to remove heat energy from first air stream 11. In some embodiments, cooling coil 42 is an evaporator of a vapor compression refrigeration system (which may be under control of controller 70). In other embodiments, cooling coil 42 may be any other type of cooling element.

Cooling coil 42 may be operated (e.g., activated, deactivated, otherwise varied, etc.) to adjust the amount of cooling provided to first air stream 11. Cooling coil 42 may be operated as a supplemental cooling source (i.e., in addition to energy recovery wheel 40) or as a primary or sole cooling source (i.e., in place of energy recovery wheel 40). For example, air conditioning system 14 may be operated in a first stage cooling mode in which only energy recovery wheel 40 is used, a second stage cooling mode in which both energy recovery wheel 40 and cooling coil 42 are used, and/or a third stage cooling mode in which only cooling coil 42 is used. Controller 70 may be configured to operate cooling coil 42 and energy recovery wheel 40 and to transition air conditioning system 14 between the various cooling modes.

Still referring to FIG. 3, air conditioning system 14 is shown to further include a condenser 44. In some embodiments, condenser 44 is located within or along second fluid channel 18 (as shown in FIG. 3). In other embodiments, condenser 44 may be located within or along first fluid channel 16. Condenser 44 and cooling coil 42 may be part of a refrigeration circuit configured to circulate a refrigerant through both condenser 44 and cooling coil 42 (e.g., using a compressor, pump, or other circulation device). In some embodiments, the heat absorbed from first air stream 11 by cooling coil 42 may be transported via the refrigeration circuit to condenser 44 and subsequently rejected into second air stream 13. In some embodiments, condenser 44 includes a plurality of sections (i.e., sections 44a, 44b) which may be activated or deactivated independently (e.g., using one or more controlled electronic valves) to adjust an amount of heat rejected into second air stream 13.

Condenser 44 is shown to include a pressure sensor 46. Pressure sensor 46 may be configured to measure a refrigerant pressure (e.g., a refrigerant head pressure) at or in condenser 44. For embodiments in which condenser 44 includes multiple sections, pressure sensor 46 may include multiple pressure sensors for each condenser section. For example, pressure sensor 46a may measure a refrigerant pressure at condenser section 44a and pressure sensor 46b may measure a refrigerant pressure at condenser section 44b.

The pressure measured by pressure sensor 46 may be used (e.g., by controller 70) to control air conditioning system 14 and to determine when to transition air conditioning system 14 between the various cooling modes. For example, upon a transition from the second stage cooling mode (i.e., in which both energy recovery wheel 40 and cooling coil 42 are used to chill first air stream 11) to the third stage cooling mode (i.e., in which only cooling coil 42 is used to chill first air stream 11), the pressure measured by pressure sensor 46 may be recorded. Controller 70 may continue to monitor the pressure measured by pressure sensor 46 while operating air conditioning system 14 in the third stage cooling mode. Controller 70 may continue to operate air conditioning system 14 in the third stage cooling mode until the measured pressure drops below the pressure value which was recorded upon the transition to the third stage cooling mode. Advantageously, by measuring the refrigerant head pressure at condenser 44, it is unnecessary to measure the temperature of second air stream 13 when determining whether to transition back to the second stage cooling mode. Indeed, a measurement of refrigerant head pressure can advantageously provide an indication of a true cooling load experienced by the active cooling system.

Still referring to FIG. 3, air conditioning system 14 is shown to include fans 62-68. Fans 62 and 64 may be located within first fluid channel 16 and may be operated (e.g., motors thereof by controller 70) to cause first air stream 11 to flow through first fluid channel 16. Fans 62 and 64 may be arranged at various locations within first fluid channel 16 or outside first fluid channel 16. As shown in FIG. 3, fans 62 and 64 are arranged in a stacked configuration. Fan 62 may be positioned to cause airflow through energy recovery wheel 40 whereas fan 64 may be positioned to cause airflow around energy recovery wheel 40. In some embodiments, fans 62 and 64 may each be positioned to cause airflow through a subset of cooling coil sections 42a-42d. For example, fan 62 may be positioned to cause airflow through cooling coil sections 42c and 42d whereas fan 64 may be positioned to cause airflow through cooling coil sections 42a and 42b.

Fans 66 and 68 may be located within second fluid channel 18 and may be operated (e.g., by controller 70) to cause second air stream 13 to flow through second fluid channel 18. Fans 66 and 68 may be arranged at various locations within second fluid channel 18 or outside second fluid channel 18. As shown in FIG. 3, fans 66 and 68 are arranged in a stacked configuration. Fan 68 may be positioned to cause airflow through energy recovery wheel 40 whereas fan 66 may be positioned to cause airflow around energy recovery wheel 40. In some embodiments, fans 66 and 68 may each be positioned to cause airflow through a subset of condenser sections 44a and 44b. For example, fan 68 may be positioned to cause airflow through condenser section 44a whereas fan 66 may be positioned to cause airflow through condenser section 44b.

In some embodiments, fans 62-68 are variable speed fans. The rotational speed of fans 62-68 may be modulated or adjusted by controller 70 to increase or decrease the airflow through fluid channels 16 and 18.

Still referring to FIG. 3, air conditioning system 14 is shown to include a plurality of dampers 48-58. Dampers 48-58 may be parallel plate dampers, opposing plate dampers, bellows, or other flow restrictors capable of regulating the flow of first air stream 11 and second air stream 13. In some embodiments, dampers 48-58 are automatic dampers. For example, dampers 48-58 may include an electric motor, a solenoid, or other electric or electromagnetic actuator (under the control of controller 70) for selectively opening and closing the dampers. By variably opening and closing, dampers 48-58 may regulate the flow rate (e.g., volumetric flow rate, flow velocity, mass flow rate) of first air stream 11 and second air stream 13 through air conditioning system 14.

Dampers 48-58 may receive a control signal from controller 70. In some embodiments, the control signal may instruct dampers 48-58 to move into a target position (e.g., a completely open position, a completely closed position, a 25% open position, a 62% open position, etc.). In other embodiments, the control signal may instruct dampers 48-58 to achieve a target flow rate through air conditioning system 14. Dampers 48-58 may translate a target flow rate into a target damper position by referencing a conversion table, a translation function, or stored calibration data. In other embodiments, dampers 48-58 may include feedback control functionality. For example, dampers 48-58 may use a feedback flow rate signal to adaptively adjust a damper position to achieve the target flow rate.

Dampers 48-58 are shown to include a return air damper 48, a supply air damper 50, and fan isolation dampers 52-58. Return air damper 48 may be located along first inlet 20 and may be operated (e.g., by controller 70) to regulate the flow of first air stream 11 through inlet 20. Similarly, supply air damper 50 may be located along first outlet 22 and may be operated to regulate the flow of first air stream 11 through outlet 22. Each of fan isolation dampers 52-58 may be associated with one of fans 62-68 and may be positioned to regulate the flow through a fan with which the isolation damper is associated. For example, fan isolation dampers 52 and 54 are shown positioned immediately upstream of fans 62 and 64, respectively. Fan isolation damper 52 may be operated to restrict airflow through fan 62 and fan isolation damper 54 may be operated to restrict airflow through fan 64. Similarly, fan isolation dampers 56 and 58 are shown positioned immediately upstream of fans 66 and 68 respectively. Fan isolation damper 56 may be operated to restrict airflow through fan 66 and fan isolation damper 58 may be operated to restrict airflow through fan 68.

Still referring to FIG. 3, air conditioning system 14 is shown to include filters 72-76. Filter 72 may be positioned upstream of energy recovery wheel 40 within first fluid channel 16. Filter 74 may be positioned downstream of energy recovery wheel 40 within first fluid channel 16. Filter 76 may be positioned upstream or downstream of energy recovery wheel 40 within second fluid channel 18. Filters 72-76 may be used to prevent foreign matter from entering air conditioning system 14 or interfering with the operation of energy recovery wheel 40 or cooling coils 42.

In some embodiments, air conditioning system 14 includes differential pressure sensors 78-82. Each of pressure sensors 78-82 may include multiple pressure measurement devices. In some embodiments, each of differential pressure sensors 78-82 may be configured to measure a pressure differential across one of filters 72-76 (e.g., by measuring a pressure upstream and downstream of the filter). For example, differential pressure sensor 78 may measure a differential pressure across filter 72, differential pressure sensor 80 may measure a differential pressure across filter 74, and differential pressure sensor 82 may measure a differential pressure across filter 76. The outputs from pressure sensors 78-82 may be provided to controller 70. The pressure differentials measured by pressure sensors 78-82 may be used by controller 70 to determine when filters 72-76 require cleaning or replacement. In some embodiments, the pressure differentials measured by pressure sensors 78-82 may be used by controller 70 to determine a flow rate of first air stream 11 and/or second air stream 13.

Still referring to FIG. 3, air conditioning system 14 is shown to include a plurality of sensors 84-100 including pressure sensor 88, temperature sensors 84, 90, 98, and 100, and humidity sensors 86 and 92. Temperature sensor 84 and humidity sensor 86 may be positioned proximate to first inlet 20 (e.g., upstream of fans 52 and 54) and may be configured to measure a temperature and a humidity of return air 30. Pressure sensor 88, temperature sensor 90, and humidity sensor 92 may be positioned proximate to first outlet 22 (e.g., downstream of filter 74 and/or cooling coil 42) and may be configured to measure a pressure, temperature, and humidity of supply air 34.

Temperature sensor 98 may be positioned upstream of energy recovery wheel 40 and may be configured to measure the temperature of first air stream 11 upstream of energy recovery wheel 40 (i.e., before passing through energy recovery wheel 40). Temperature sensor 100 may be positioned downstream of energy recovery wheel 40 and may be configured to measure the temperature of first air stream 11 downstream of energy recovery wheel 40 (i.e., after passing through energy recovery wheel 40). In some embodiments, temperature sensors 98 and 100 may be positioned immediately upstream and immediately downstream of energy recovery wheel 40. The difference in the temperatures measured by sensors 98 and 100 may be used to determine whether the temperature of first air stream 11 has increased or decreased by passing through energy recovery wheel 40.

Still referring to FIG. 3, air conditioning system 14 is shown to include a controller 70. Controller 70 may receive input from pressure sensors 46, 78-82 and 88, temperature sensors 84, 90, 98, and 100, and humidity sensors 86 and 92 and provide control signals to energy recovery wheel 40, a cooling coil 42, a condenser 44, dampers 48-58, and fans 62-68. Although FIG. 3 shows controller 70 as part of air conditioning system 14, in other embodiments controller 70 may be a controller for a plurality of HVAC devices, a supervisory controller for a plurality of BAS subsystems, or implemented as part of a cloud-hosted suite of building management applications (e.g., a PANOPTIX® brand building management suite, as sold by Johnson Controls, Inc.).

Controller 70 may be configured to operate energy recovery wheel 40, cooling coil 42, condenser 44, dampers 48-58, and fans 62-68. For example, controller 70 may be configured to activate, deactivate, and/or control a rotational speed of energy recovery wheel 40. Controller 70 may further be configured to activate or deactivate the various sections of cooling coil 42 and condenser 44. Controller 70 may be configured to open and close dampers 48-58 and to activate, deactivate, and/or control the speeds of fans 62-68. In some embodiments, controller 70 is configured to operate air conditioning system 14 in a first stage cooling mode in which only energy recovery wheel 40 is active, a second stage cooling mode in which both energy recovery wheel 40 and cooling coil 42 are active, and a third stage cooling mode in which only cooling coil 42 is active.

Advantageously, controller 70 may be configured to control air conditioning system 14 and transition between cooling modes without relying on a measurement of the outdoor air temperature (e.g., the temperature of outdoor air 32) or a measurement of the temperature of second air stream 13. Controller 70 may use the temperature differential across energy recovery wheel 40 (e.g., measured by temperature sensors 98 and 100) as a direct indication of whether operation of energy recovery wheel 40 is adding or removing heat from first air stream 11.

In some embodiments, controller 70 is configured to determine a load on the refrigeration circuit (e.g., by measuring a refrigerant pressure at condenser 44, measuring an amount of energy, power, or electric current used by the refrigeration circuit, etc.). The load on the refrigeration circuit may indicate an amount of work performed by the refrigeration circuit to chill first air stream 11 to a supply air temperature setpoint. Advantageously, controller 70 may use the load on the refrigeration circuit to generate control signals for air conditioning system 14 without relying on or using a measurement of the outdoor air temperature or the temperature of second air stream 13.

Figure 4A:
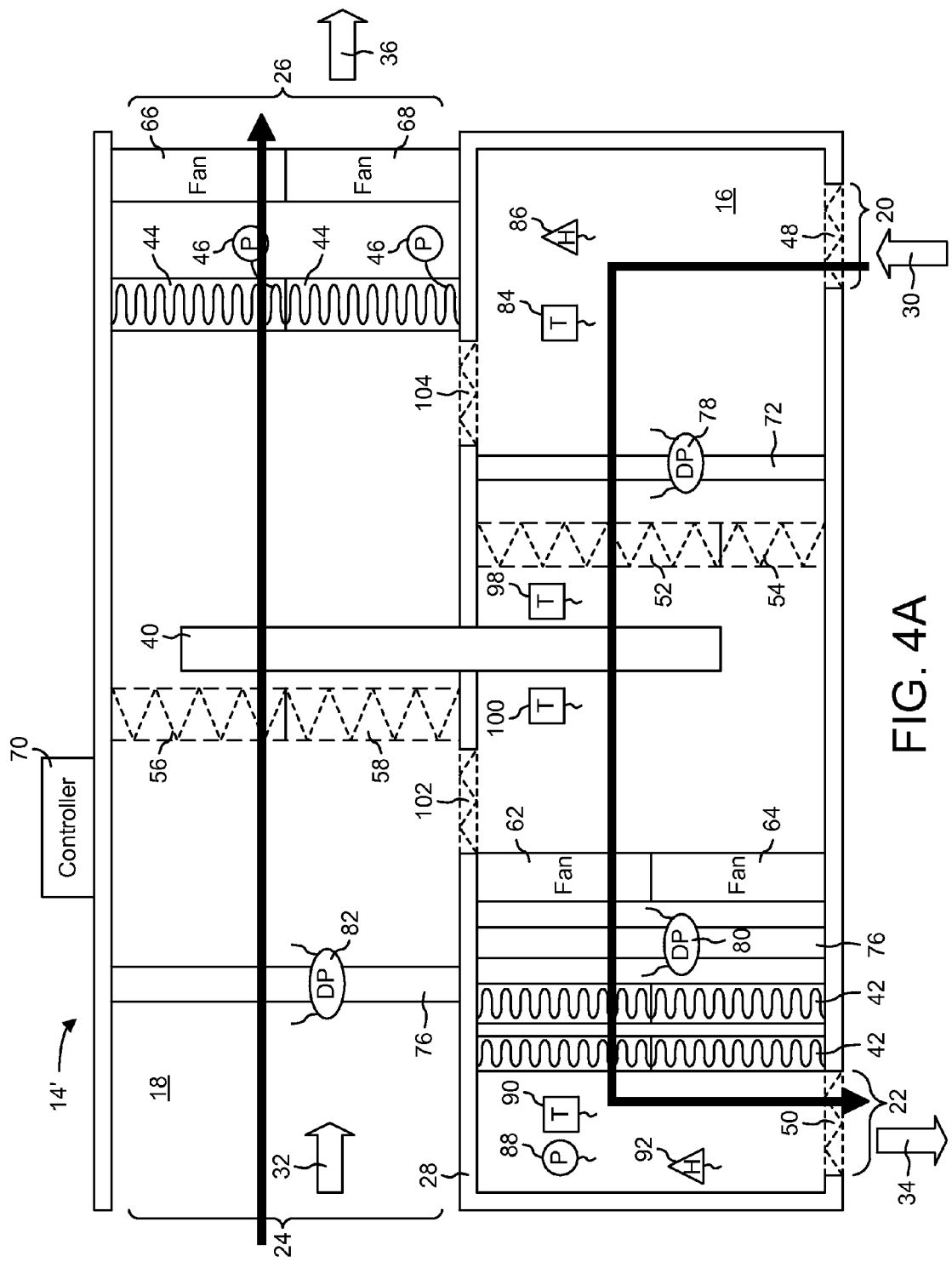
FIGS. 4A and 4B are cross-sectional drawings of the air conditioning system of FIG. 1, showing the flow paths of the first air stream and the second air stream with the air conditioning system operating in a recirculation mode.
Figure 4B:
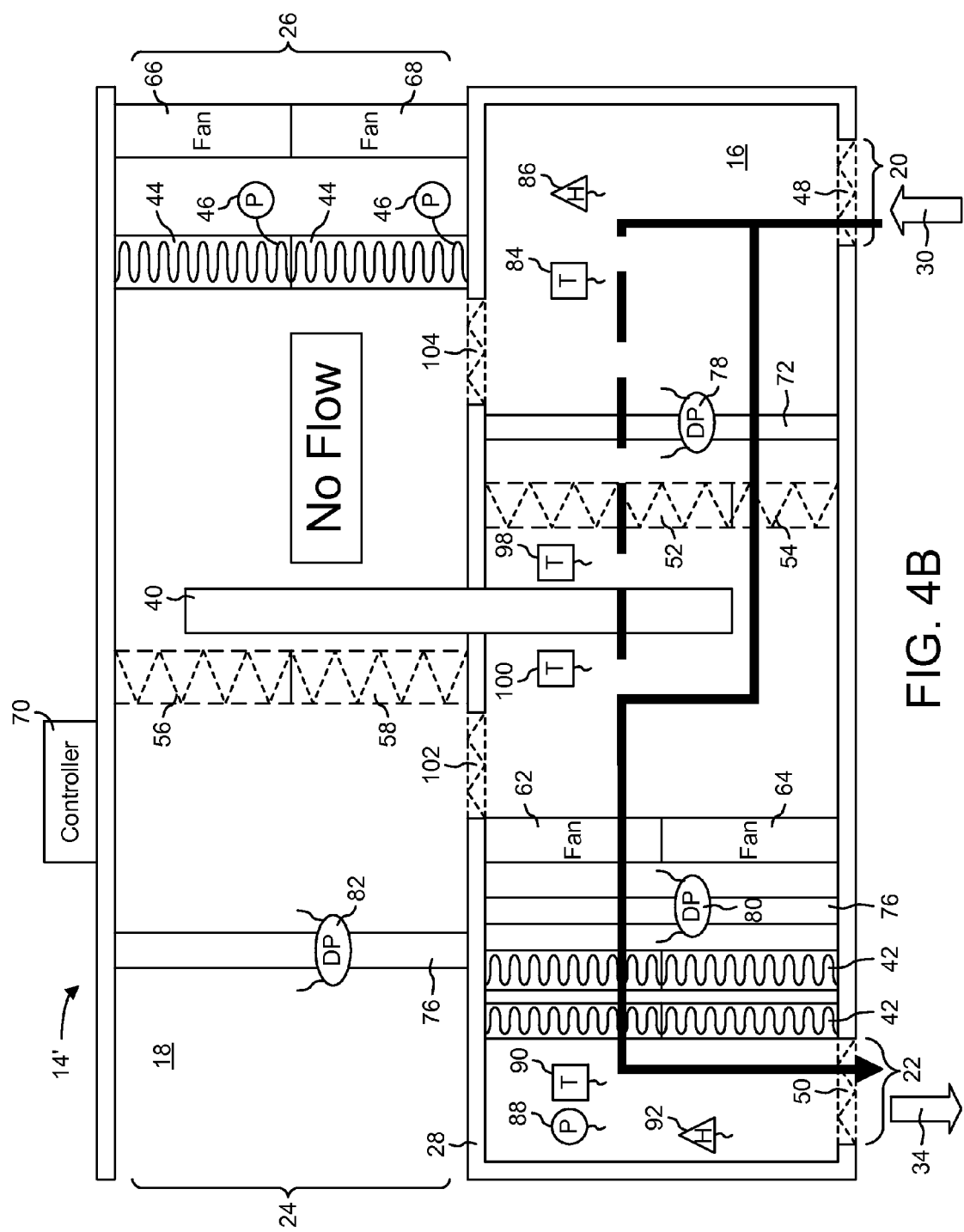
Figure 5:
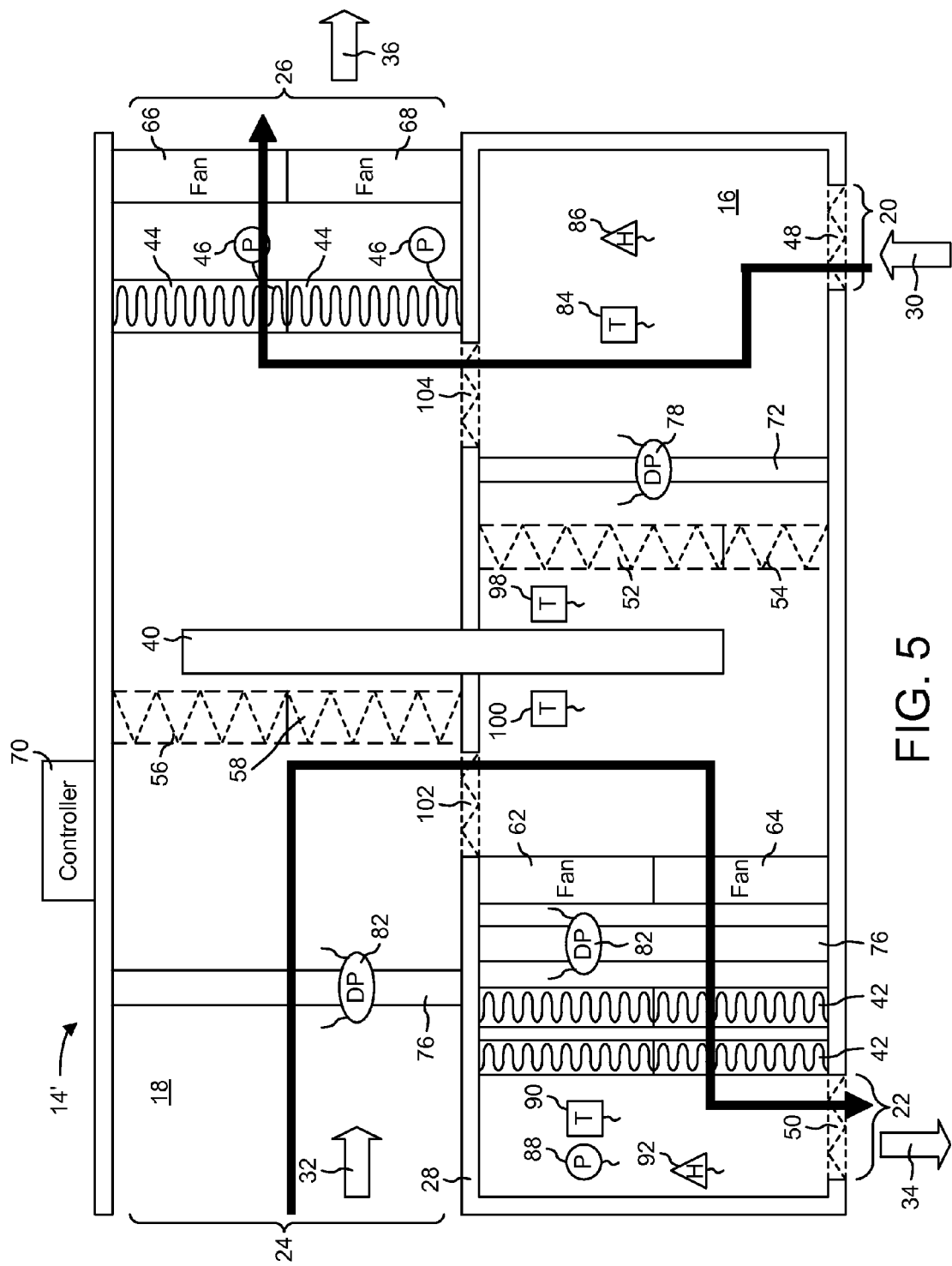
FIG. 5 is a cross-sectional drawing of the air conditioning system of FIG. 1, showing the flow paths of the first air stream and the second air stream with the air conditioning system operating in a ventilation mode, according to an exemplary embodiment.

Referring now to FIGS. 4A-B and FIG. 5, air conditioning system 14 is shown, according to an alternative exemplary embodiment (i.e., air conditioning system 14'). Air conditioning system 14' is shown to include many of the same components of air conditioning system 14. For example, air conditioning system 14' is shown to include energy recovery wheel 40, cooling coil 42, condenser 44, dampers 48-58, fans 62-68, pressure sensors 46, 78-82 and 88, temperature sensors 84, 90, 98, and 100, and humidity sensors 86 and 92. These components of air conditioning system 14' may be the same or similar as previously described with reference to FIG. 3. However, in air conditioning system 14', several of the components are shown in different locations. For example, dampers 56-58 are shown upstream of energy recovery wheel 40 and fans 66-68 are shown downstream of condenser 44. Additionally, in air conditioning system 14', fans 62-64 are shown downstream of energy recovery wheel 40, and filter 72 is shown upstream of dampers 52-54.

The changed locations of dampers 52-58 and fans 62-68 in air conditioning system 14' (relative to air conditioning system 14) may advantageously accommodate two additional components—a first ventilation damper 102 and a second ventilation damper 104. Ventilation dampers 102-104 may be located within dividing wall 28 on opposite sides of energy recovery wheel 40. When open, ventilation dampers 102-104 may form a fluid connection between first fluid channel 16 and second fluid channel 18. Ventilation dampers 102-104 may be operated in coordination with dampers 52-58 (e.g., by controller 70) to transition air conditioning system 14' between a recirculation mode (shown in FIGS. 4A-4B) and a ventilation mode (shown in FIG. 5).

Referring specifically to FIGS. 4A-4B, air conditioning system 14' is shown in a recirculation mode. In the recirculation mode, ventilation dampers 102-104 may be closed and some or all of dampers 52-58 may be open. Return air 30 drawn into air conditioning system 14' through first inlet 20 may pass through one or both of dampers 52-54, through energy recovery wheel 40, and may be delivered to data center 10 as supply air 34. In some operating modes (e.g., shown in FIG. 4A), outside air 32 drawn into air conditioning system 14' through second inlet 24 may pass through one or both of dampers 56-58, through energy recovery wheel 40, and may be exhausted from air conditioning system 14' through second outlet 26 as exhaust air 36. In other operating modes, (e.g., shown in FIG. 4B), outside air 32 may not be drawn into air conditioning system 14'.

The recirculation mode may be used to provide free cooling for first air stream 11 (e.g., via energy recovery wheel 40) when the humidity of outside air 32 is not within an acceptable humidity range (e.g., if outside air 32 too humid or too dry). Advantageously, by closing ventilation dampers 102-104 and operating air conditioning system 14' in the recirculation mode, first air stream 11 and second air stream 13 are isolated from each other and the humidity level present in return air 30 is maintained in supply air 34. In other words, the humidity level of second air stream 13 may not have an effect on the humidity level of supply air 34 when air conditioning system 14' is operated in the recirculation mode. Heat transfer between first air stream 11 and second air stream 13 may be accomplished using either energy recovery wheel 40, the refrigeration circuit (i.e., cooling coil 42 and condenser 44), or a combination thereof.

Referring specifically to FIG. 4A, air conditioning system 14' is shown operating in the recirculation mode with energy recovery wheel 40 active. FIG. 4A may correspond to the first stage cooling mode or the second stage cooling mode. When energy recovery wheel 40 is active, damper 52 may be open, thereby allowing first air stream 11 to flow through damper 52 and energy recovery wheel 40. Additionally, when energy recovery wheel 40 is active, one or both of dampers 56-58 may be open. Outside air 32 drawn into air conditioning system 14' through second inlet 24 may pass through one or both of dampers 56-58, through energy recovery wheel 40, and may be exhausted from air conditioning system 14' through second outlet 26 as exhaust air 36.

Advantageously, air conditioning system 14' may not measure or use the temperature of second air stream 13 or the temperature of outside air 32 when operating in the recirculation mode with energy recovery wheel 40 active. Air conditioning system 14' may use the temperature differential of first air stream 11 across energy recovery wheel 40 and/or a measurement of the load on the refrigeration circuit to determine whether to activate, deactivate, or adjust a control signal provided to energy recovery wheel 40 or the refrigeration circuit without relying on temperature measurements of either second air stream 13 or outside air 32.

Referring specifically to FIG. 4B, air conditioning system 14' is shown operating in the recirculation mode with energy recovery wheel 40 inactive. FIG. 4B may correspond to the third stage cooling mode. When energy recovery wheel 40 is inactive, damper 52 may be closed or partially closed. When damper 52 is closed or partially closed, some or all of first air stream 11 may flow through damper 54, around energy recovery wheel 40. In some embodiments, when energy recovery wheel 40 is inactive, airflow may be prevented from occurring through second fluid channel 18. For example, dampers 56-58 may be closed or fans 66-68 may be inactive. In other embodiments, the airflow through second fluid channel 18 may be modulated to adjust an amount of cooling provided by the refrigeration circuit when energy recovery wheel 40 is inactive.

Advantageously, air conditioning system 14' may not measure or use the temperature of second air stream 13 or the temperature of outside air 32 when operating in the recirculation mode with energy recovery wheel 40 inactive. When energy recovery wheel 40 is inactive, air conditioning system 14' can determine whether to activate energy recovery wheel 40 without relying on temperature measurements of either second air stream 13 or outside air 32. For example, air conditioning system 14' may receive a measurement of the load on the refrigeration circuit and compare the measured load with a threshold value. If the measured load on the refrigeration circuit is less than the threshold value, air conditioning system 14' may reactivate energy recovery wheel 40.

Referring now to FIG. 5, air conditioning system 14' is shown operating in the ventilation mode. In the ventilation mode, ventilation dampers 102-104 may be open and dampers 52-58 may be closed. Outside air 32 drawn into air conditioning system 14' through second inlet 24 may pass through ventilation damper 102, through cooling coil 42, and may be delivered to data center 10 as supply air 34. Return air 30 drawn into air conditioning system 14' through first inlet 20 may pass through ventilation damper 104, through condenser 44, and may be exhausted from air conditioning system 14' through second outlet 26 as exhaust air 36. When operating in the ventilation mode, neither of the air streams passing through air conditioning system 14' is a recirculated air stream.

In some embodiments, the ventilation mode may be used to provide free cooling for data center 10 when the humidity of outside air 32 is within an acceptable humidity range. In the ventilation mode, energy recovery wheel 40 may be inactive. Cooling coil 42 may be used to provide any required cooling to outside air 32 before outside air 32 is delivered to air conditioned space 12 as supply air 34. Advantageously, air conditioning system 14' may not measure or use the temperature of second air stream 13 or the temperature of outside air 32 when operating in the ventilation mode.

Figure 6:
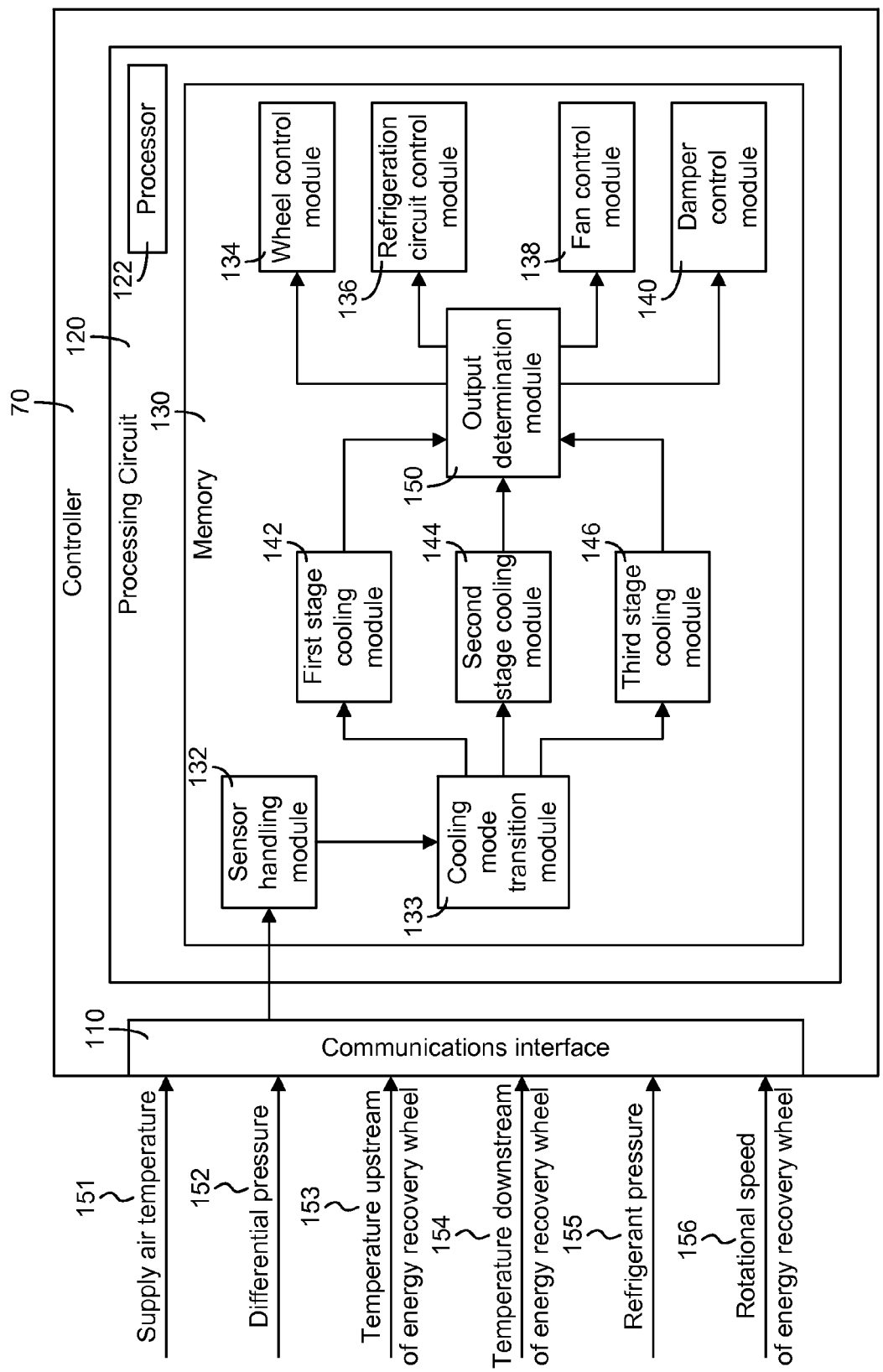
FIG. 6 is a block diagram of a controller configured to operate the air conditioning system of FIG. 1 and to transition the air conditioning system between a plurality of cooling modes, according to an exemplary embodiment.

Referring now to FIG. 6, a block diagram of controller 70 is shown, according to an exemplary embodiment. Controller 70 is shown to include a communications interface 110, and a processing circuit 120. Communications interface 110 may include wired or wireless interfaces (e.g., jacks, antennas, transmitters, receivers, transceivers, wire terminals, etc.) for conducting electronic data communications with the various components of air conditioning system 14 or other external devices or data sources. Data communications may be conducted via a direct connection (e.g., a wired connection, an ad-hoc wireless connection, etc.) or a network connection (e.g., an Internet connection, a LAN, WAN, or WLAN connection, etc.). For example, communications interface 110 can include an Ethernet card and port for sending and receiving data via an Ethernet-based communications link or network. In another example, communications interface 110 can include a WiFi transceiver, a cellular transceiver, or a mobile phone transceiver for communicating via a wireless communications network.

Communications interface 110 may receive input signals from the various sensory devices of air conditioning system 14. For example, communications interface 110 is shown receiving a supply air temperature input signal 151 (e.g., from supply air temperature sensor 90), a differential pressure input signal 152 (e.g., from differential pressure sensors 78-82), a temperature upstream of energy recovery wheel input signal 153 (e.g., from temperature sensor 98), a temperature downstream of energy recovery wheel input signal 154 (e.g., from temperature sensor 100), a refrigerant pressure input signal 155 (e.g., from refrigerant pressure sensor 46), and a rotational speed input signal 156 (e.g., indicating a rotational speed of energy recovery wheel 40). In some embodiments, communications interface may receive other types of input signals which may be used to determine a load on the refrigeration circuit. For example, communications interface 110 may receive an input signal measuring an amount of power, energy, and/or electric current used by the refrigeration circuit.

Notably, communications interface 110 is not shown receiving a measurement of the temperature of second air stream 13. Advantageously, controller 70 may not require or use the temperature of second air stream 13 or outdoor air 32 to control air conditioning system 14. Input signals 151-156 received via communications interface 110 may be provided to processing circuit 120. Processing circuit 120 may use input signals 151-156 to generate control signals for the various control devices of air conditioning system 114 (e.g., energy recovery wheel 40, cooling coil 42, condenser 44, dampers 48-58, fans 62-68, etc.). Communications interface 110 may receive the control signals from processing circuit 120 and output the control signals to the control devices.

Still referring to FIG. 6, processing circuit 120 is shown to include a processor 122 and memory 130. Processor 122 can be implemented as a general purpose processor, an application specific integrated circuit (ASIC), one or more field programmable gate arrays (FPGAs), a group of processing components, a microcontroller, or other suitable electronic processing components.

Memory 130 (e.g., memory device, memory unit, storage device, etc.) may include one or more devices (e.g., RAM, ROM, solid state memory, hard disk storage, etc.) for storing data and/or computer code for completing or facilitating the various processes, layers and modules described in the present application. Memory 130 may include volatile memory or non-volatile memory. Memory 130 may include database components, object code components, script components, or any other type of information structure for supporting the various activities and information structures of the present disclosure. According to an exemplary embodiment, memory 130 is communicably connected to processor 122 via processing circuit 120 and includes computer code for executing (e.g., by processing circuit 120 and/or processor 122) one or more processes described herein.

Still referring to FIG. 6, memory 130 is shown to include a sensor handling module 132. Sensor handling module 132 may be configured to handle sensor input signals and measurements received via communications interface 110 (e.g., input signals 151-156). In some embodiments, the sensor measurements may be received as an analog data signal. Sensor handling module 132 may include an analog-to-digital converter for translating the analog signal into a digital data value. Sensor handling module 132 may segment a continuous data signal into discrete measurement values by sampling the sensor information periodically (e.g., once per second, once per millisecond, once per minute, etc.). In some embodiments, the sensor information may be received as a measured voltage. Sensor handling module 132 may convert the voltage values into pressure measurements, temperature measurements, or humidity measurements using a conversion formula, a translation table, or other conversion criteria.

In some embodiments, sensor handling module 132 may attach a time stamp to the received sensor information to organize the data by time. Sensor handling module 132 may assign an identifier (e.g., a label, tag, etc.) to each measurement to organize the data by source. For example, the identifier may signify whether the sensor information is received from a pressure sensor, a temperature sensor, or a humidity sensor. The identifier may also identify a particular sensor from which the sensor information is received. Sensor handling module 132 may convert raw input signals into a format in which the input signals can be further processed and used to control air conditioning system 14.

Sill referring to FIG. 6, memory 130 is shown to include a cooling mode transition module 133. Cooling mode transition module 133 may use one or more sensor input signals received via communications interface 110 (e.g., input signals 151-156) to select a cooling mode in which to operate air conditioning system 110. Cooling mode transition module 133 may select the cooling mode from a set of cooling modes including a first stage cooling mode, a second stage cooling mode, and a third stage cooling mode. In the first stage cooling mode, energy recovery wheel 40 may be active and the refrigeration circuit may be inactive. In the second stage cooling mode, both energy recovery wheel 40 and the refrigeration circuit may be active. In the third stage cooling mode, energy recovery wheel 40 may be inactive and the refrigeration circuit may be active. The first, second, and third stage cooling modes are described in greater detail below with reference to first stage cooling module 142, second stage cooling module 144, and third stage cooling module 146.

Cooling mode transition module 133 may include instructions and/or control logic for switching or transitioning between cooling modes. Cooling mode transition module 133 may determine whether to switch from one cooling mode to another based on the input signals 151-156 received via communications interface 110. When air conditioning system 14 is operating in the first stage cooling mode, cooling mode transition module 133 may determine whether to transition into the second stage cooling mode. When air conditioning system 14 is operating in the second stage cooling mode, cooling mode transition module 133 may determine whether to transition into either the first stage cooling mode or the third stage cooling mode. When air conditioning system 14 is operating in the third stage cooling mode, cooling mode transition module 133 may determine whether to transition into the second stage cooling mode.

In the first stage cooling mode, cooling mode transition module 133 may be configured to monitor the rotational speed of energy recovery wheel 40 and/or the temperature of supply air 34 (e.g., using input signals 156 and 151). In some embodiments, cooling mode transition module 133 transitions air conditioning system 14 from the first stage cooling mode to the second stage cooling mode in response to the speed of rotation of energy recovery wheel 40 exceeding a threshold value for a predetermined period of time. In some embodiments, cooling mode transition module 133 transitions air conditioning system 14 from the first stage cooling mode to the second stage cooling mode in response to the temperature of supply air 34 exceeding a supply air temperature setpoint.

In the second stage cooling mode, cooling mode transition module 133 may be configured to monitor the temperature "$T_u$" upstream of energy recovery wheel 40 and the temperature "$T_d$" downstream of energy recovery wheel 40 (e.g., using input signals 153 and 154). Cooling mode transition module 133 may be configured to transition air conditioning system 14 from the second stage cooling mode to the first stage cooling mode in response to the refrigeration circuit not being used for a predetermined period of time (e.g., based on refrigerant pressure input signal 155 or another input signal indicating a load on the refrigeration circuit). Not using the refrigeration circuit for the predetermined period of time may indicate that the amount of cooling required can be provided by energy recovery wheel 40 and that the refrigeration circuit can be deactivated. In some embodiments, cooling mode transition module 133 requires the temperature downstream of energy recovery wheel 40 to be less than the temperature upstream of energy recovery wheel 40 to transition from the second stage cooling mode to the first stage cooling mode (i.e., in addition to non-usage of the refrigeration circuit for the predetermined period of time).

In the second stage cooling mode, cooling mode transition module 133 may be configured to monitor the temperature of supply air 34 (e.g., using supply air temperature signal 151). Cooling mode transition module 133 may be configured to transition air conditioning system 14 from the second stage cooling mode to the first stage cooling mode in response to the temperature of supply air 34 being less than a supply air temperature setpoint.

Cooling mode transition module 133 may be configured to transition air conditioning system 14 from the second stage cooling mode to the third stage cooling mode in response to a determination that the energy savings provided by operating energy recovery wheel 40 is exceeded by the energy cost of operating energy recovery wheel 40. Cooling mode transition module 133 may determine the energy savings and/or energy cost of operating energy recovery wheel 40 by calculating the temperature differential of first air stream 11 "$T_{diff}$" across energy recovery wheel 40. For example, cooling mode transition module 133 may calculate the temperature differential $T_{diff}$ by subtracting the temperature of first air stream 11 upstream of energy recovery wheel 40 (e.g., $T_u$, indicated by input signal 153) from the temperature of first air stream 11 downstream of energy recovery wheel 40 (e.g., $T_d$, indicated by input signal 154). The difference between the upstream and downstream temperature values may define the temperature differential across energy recovery wheel 40 (i.e., $T_{diff}=T_d-T_u$). The temperature differential $T_{diff}$ may be positive (i.e., $T_d>T_u$) or negative (i.e., $T_d<T_u$).

In some embodiments, cooling mode transition module 133 may use the temperature differential across energy recovery wheel 40 as a proxy for energy savings and/or energy cost. For example, cooling mode transition module 133 may be configured to transition air conditioning system 14 from the second stage cooling mode to the third stage cooling mode in response to $T_d$ exceeding $T_u$. In some embodiments, cooling mode transition module 133 may determine or estimate an airflow rate of first air stream 11 and use the airflow rate in conjunction with the temperature differential $T_{diff}$ to calculate an actual energy cost and/or savings resulting from the operation of energy recovery wheel 40. In some embodiments, cooling mode transition module 133 may be configured to transition air conditioning system 14 from the second stage cooling mode to the third stage cooling mode in response to the temperature of supply air 34 exceeding a supply air temperature setpoint (e.g., for a predetermined period of time). For example, if energy recovery wheel 40 is adding heat energy to first air stream 11, the refrigeration circuit may be unable to chill supply air 34 to the supply air temperature setpoint (i.e., for embodiments in which the heat transfer capacity of energy recovery wheel 40 exceeds the heat transfer capacity of the refrigeration circuit). If the temperature of supply air 34 exceeds the supply air temperature setpoint for a predetermined period of time, cooling mode transition module 133 may determine that continued operation of energy recovery wheel 40 is counterproductive and may cause a transition into the third stage cooling mode.

Upon a transition from the second stage cooling mode to the third stage cooling mode, cooling mode transition module 133 may record the pressure of the refrigerant at condenser 44 (e.g., indicated by input signal 155). The refrigerant pressure may correspond to an amount of work performed by a compressor of the refrigeration circuit to chill first air stream 11 to a setpoint supply air temperature (e.g., using cooling coil 42 and condenser 44). If the temperature of outdoor air 32 rises, the compressor may work harder to maintain supply air 34 at a supply air temperature setpoint and the measured refrigerant head pressure at condenser 44 may also rise. The refrigerant pressure may be proportional to the temperature of outside air 32 (e.g., with an offset for fan heat) when energy recovery wheel 40 is not performing any energy recovery. Accordingly, the refrigerant pressure may be used as a proxy for both the amount of work performed by the compressor and the temperature of outside air 32.

In some embodiments, cooling mode transition module 133 may be configured to wait for a predetermined period of time after deactivating energy recovery wheel 40 before recording the refrigerant pressure (e.g., in order to allow the thermal energy stored in energy recovery wheel 40 to dissipate). In some embodiments, cooling mode transition module 133 may wait until the temperature differential $T_{diff}$ across energy recovery wheel 40 is zero or approximately zero before recording the refrigerant pressure.

In the third stage cooling mode, cooling mode transition module 133 may monitor the refrigerant head pressure at condenser 44 (e.g., measured by pressure sensor 46). In some embodiments, cooling mode transition module 133 may be configured to transition air conditioning system 14 from the third stage cooling mode to the second stage cooling mode in response to the refrigerant head pressure at condenser 44 dropping below the pressure value which was recorded upon the transition from the second stage cooling mode to the third stage cooling mode. A decrease in the condenser head pressure below the previously-recorded transition value may indicate that the temperature of outdoor air 32 has dropped below the outdoor air temperature associated with the previous transition to the third stage cooling mode.

In some embodiments, cooling mode transition module 133 may record a number of active compressors during a transition from the second stage cooling mode to the third stage cooling mode. Subsequently, when determining whether to transition from the third stage cooling mode back to the second stage cooling mode, cooling mode transition module 133 may ensure that the number of active compressors is the same as the previously-recorded number of active compressors. The number of active compressors may affect the refrigerant pressure measured by sensor 46 and may be relevant in determining a load on the refrigeration circuit.

In some embodiments, an indication of the amount of work performed by the refrigeration circuit may be obtained using alternative or additional techniques such as monitoring an amount of energy or power consumed by the compressor (e.g., measured in kW, Joules, etc.) or an amount of electric current drawn by the compressor (e.g., measured in Amps). The amount of energy, power, or electric current consumed by the compressor may be used in place of or in addition to the condenser head pressure in determining whether to transition between the second stage cooling mode and the third stage cooling mode.

Advantageously, cooling mode transition module 133 can use the temperatures of the recirculated air stream (e.g., first air stream 11) upstream and downstream of energy recovery wheel 40 to determine whether operation of energy recovery wheel 40 adds or removes heat energy from first air stream 11 without relying on a temperature measurement of second air stream 13. Cooling mode transition module 133 may cause air conditioning system 14 to transition between the various cooling modes based on the temperature differential across energy recovery wheel 40.

Still referring to FIG. 6, memory 130 is shown to include a first stage cooling module 142. First stage cooling module 142 may be configured to operate air conditioning system 14 in the first stage cooling mode. In the first stage cooling mode, energy recovery wheel 40 may be active and the refrigeration circuit (e.g., cooling coil 42 and condenser 44) may be inactive. First stage cooling module 142 may receive input signal 151 indicating the temperature of supply air 34. In some embodiments, first stage cooling module 142 is configured to maintain the temperature of supply air 34 at a supply air temperature setpoint by modulating a rotational speed of energy recovery wheel 40 (e.g., using wheel control module 134).

First stage cooling module 142 may be configured to maintain the temperature of supply air 34 at the supply air temperature setpoint by modulating a rotational speed of fans 62-68 (e.g., using fan control module 138). In some embodiments, first stage cooling module 142 modulates the speed of only the outside air fans 66-68 (i.e., not using supply air fans 62-64). In some embodiments, first stage cooling module 142 maintains the temperature of supply air 34 at the supply air temperature setpoint by modulating the rotational speed of both energy recovery wheel 40 and fans 62-68.

Still referring to FIG. 6, memory 130 is shown to include a second stage cooling module 144. Second stage cooling module 144 may be configured to operate air conditioning system 14 in a second stage cooling mode. In the second stage cooling mode, both energy recovery wheel 40 and the refrigeration circuit (e.g., cooling coil 42 and condenser 44) may be active. Second stage cooling module 144 may be configured to maintain the rotational speed of energy recovery wheel 40 and/or fans 62-68 at a constant rotational speed in the second stage cooling mode. In some embodiments, second stage cooling module 144 maintains the rotational speed of energy recovery wheel 40 and/or fans 62-68 at a maximum rotational speed.

Second stage cooling module 144 may receive a temperature measurement of supply air 34 from temperature sensor 90. In some embodiments, second stage cooling module 144 is configured to maintain the temperature of supply air 34 at a supply air temperature setpoint by operating the refrigeration circuit. Second stage cooling module 144 may be configured to activate or deactivate one or more sections of cooling coil 42 (i.e., sections 42a-42d) and one or more sections of condenser 44 (i.e., sections 44a-44b) to modulate an amount of cooling provided by the refrigeration circuit. Second stage cooling module 144 may interact with the refrigeration circuit directly (e.g., by operating valves, activating or deactivating a refrigerant pump, etc.), or indirectly (e.g., using refrigeration circuit control module 136).

Still referring to FIG. 6, memory 130 is shown to include a third stage cooling module 146. Third stage cooling module 146 may be configured to operate air conditioning system 14 in the third stage cooling mode. In the third stage cooling mode, energy recovery wheel 40 may be inactive and the refrigeration circuit (e.g., cooling coil 42 and condenser 44) may be active. Third stage cooling module 146 may receive input signal 151 indicating the temperature of supply air 34. In some embodiments, third stage cooling module 146 is configured to maintain the temperature of supply air 34 at a supply air temperature setpoint by operating the refrigeration circuit. Third stage cooling module 146 may receive input signal 155 indicating a pressure of the refrigerant at condenser 44. In some embodiments, third stage cooling module 146 is configured to maintain the refrigerant pressure at a condensing pressure setpoint by modulating a rotational speed of outside air fans 66-68.

Still referring to FIG. 6, memory 130 is shown to include an output determination module 150. Output determination module 150 may receive control signals from first stage cooling module 142, second stage cooling module 144, and third stage cooling module 146. Output determination module 150 may determine appropriate instructions for the various device-specific control modules of controller 70. For example, output determination module 150 may determine an appropriate wheel control signal for wheel control module 134, an appropriate fan control signal for fan control module 138, an appropriate damper control signal for damper control module 140, etc. Output determination module 150 may perform translation, formatting, demultiplexing, or other intermediate signal processing steps required to convert a control signal from cooling modules 142-146 into device-specific components which may be used by device control modules 134-140.

Still referring to FIG. 6, memory 130 is shown to include a wheel control module 134. Wheel control module 134 may provide a control signal to energy recovery wheel 40 or to a device configured to operate energy recovery wheel 40 (e.g., an attached motor, an actuator, etc.). Wheel control module 134 may be configured to activate energy recovery wheel 40, deactivate energy recovery wheel 40, and/or control the rotational speed of energy recovery wheel 40.

In some embodiments, wheel control module 134 activates energy recovery wheel 40 when air conditioning system 14 is in the first stage cooling mode or the second stage cooling mode. In the first stage cooling mode, wheel control module 134 may modulate the rotational speed of energy recovery wheel 40 to maintain the temperature of supply air 34 (e.g., measured by temperature sensor 90) at a supply air temperature setpoint. In the second stage cooling mode, wheel control module 134 may maintain the rotational speed of energy recovery wheel 40 at a fixed value. In some embodiments, wheel control module 134 may cause energy recovery wheel 40 to rotate at a maximum rotational speed in the second stage cooling mode. Wheel control module 134 may be configured to deactivate, deenergize, or stop rotation of energy recovery wheel 40 when air conditioning system 14 is in the third stage cooling mode.

Still referring to FIG. 6, memory 130 is shown to include a refrigeration circuit control module 136. Refrigeration circuit control module 136 may provide a control signal to cooling coil 42 and condenser 44 to control the flow of refrigerant therethrough. For example, cooling coil 42 and condenser 44 may be outfitted with electronic valves capable of opening or closing in response to a control signal from controller 70. Opening and closing the electronic valves may control the flow of refrigerant into cooling coil 42 and/or condenser 44. Refrigeration circuit control module 136 may provide a control signal opening or closing the electronic valves, thereby controlling the flow of refrigerant. Refrigeration circuit control module 136 may activate or deactivate one or more sections 42a-42d of cooling coil 42 (e.g., by opening or closing a corresponding valve) to modulate an amount of cooling provided by cooling coil 42 to first air stream 11. Refrigeration circuit control module 136 may activate or deactivate one or more sections 44a-44b of condenser 44 to modulate an amount of heat transferred from the refrigerant into second air stream 13.

In some embodiments, refrigeration circuit control module 136 activates the refrigeration circuit (e.g., cooling coil 42 and condenser 44) when air conditioning system 14 is in the second stage cooling mode or the third stage cooling mode. In the second stage cooling mode and the third stage cooling mode, refrigeration circuit control module may activate or deactivate cooling coil 42 (e.g., by section or entirely) to maintain the temperature of supply air 34 (e.g., measured by temperature sensor 90) at a supply air temperature setpoint.

Still referring to FIG. 6, memory 130 is shown to include a fan control module 138. Fan control module 138 may provide a control signal to fans 62-68 to activate, deactivate, or control a rotational speed of fans 62-68. In some embodiments, fan control module 138 operates fans 62-68 in the first stage cooling mode, the second stage cooling mode, and the third stage cooling mode. When air conditioning system 14 is initially started, supply fans 62-64 may be activated. Fan control module 138 may be configured to modulate the rotational speed of supply fans 62-64 to maintain the velocity pressure of first air stream 11 at a velocity pressure setpoint. For example, fan control module 138 may increase or decrease the rotational speed of supply fans 62-64 such that the velocity pressure of first air stream 11 (e.g., $P_v=0.5 \rho v^2$) is maintained at approximately 0.025 inches w.c. or any other setpoint as may be desirable.

In some embodiments, fan control module 138 may activate outside air fans 66-68 once supply fans 62-64 have been started. In the first stage cooling mode, fan control module 138 may modulate the rotational speed of outside air fans 66-68 to maintain the temperature of supply air 34 (e.g., measured by temperature sensor 90) at a supply air temperature setpoint. By modulating the rotational speed of outside air fans 66-68, fan control module 138 may increase or decrease an amount of heat removed from energy recovery wheel 40 by second air stream 13, thereby affecting the temperature of energy recovery wheel 40. By affecting the temperature of energy recovery wheel 40, fan control module 138 can control an amount of heat removed from first air stream 11 to maintain the temperature of supply air 34 at the supply air temperature setpoint.

In the second stage cooling mode, fan control module 138 may maintain the rotational speed of outside air fans 66-68 at a fixed value. In some embodiments, fan control module 138 may cause outside air fans 66-68 to rotate at a maximum rotational speed in the second stage cooling mode. In the third stage cooling mode, fan control module 138 may modulate the rotational speed of outside air fans 66-68 to maintain the condensing head pressure (e.g., measured by pressure sensor 46) at a head pressure setpoint.

Still referring to FIG. 6, memory 130 is shown to include a damper control module 140. Damper control module 140 may provide a control signal to dampers 48-58 and 102-104 (or to a device configured to operate dampers 48-58 and 102-104 such as an attached motor, an actuator, etc.). The control signal may instruct dampers 48-58 to move into a target position (e.g., a completely open position, a completely closed position, a 25% open position, a 62% open position, etc.) or to achieve a target flow rate. In some embodiments, damper control module 140 translates a target flow rate into a target damper position by referencing a conversion table, a translation function, or a stored calibration data. Damper control module 140 may use a feedback control signal (e.g., a damper position signal from dampers 48-58 and 102-104, a flow rate signal from differential pressure sensors 72-76, etc.) to adaptively adjust a damper position to achieve the target flow rate.

Damper control module 140 may operate return air damper 48 and supply air damper 50 to regulate the flow of first air stream 11 through inlet 20 and outlet 22 respectively. In some embodiments, damper control module 140 operates fan isolation dampers 52-58 to control the airflow through fans 62-68. For example, damper control module 140 may operate fan isolation damper 52 to restrict airflow through fan 62 and may operate fan isolation damper 54 to restrict airflow through fan 64. Similarly, damper control module 140 may operate isolation damper 56 to restrict airflow through fan 66 and may operate fan isolation damper 58 to restrict airflow through fan 68. In some embodiments, damper control module 140 may operate dampers 52-58 to control the airflow through cooling coil 42 and/or condenser 44. Damper control module 140 may operate ventilation dampers 102-104 to transition air conditioning system 14 between a recirculation mode (shown in FIG. 3 and FIGS. 4A-B) and a ventilation mode (shown in FIG. 5).

Figure 7:
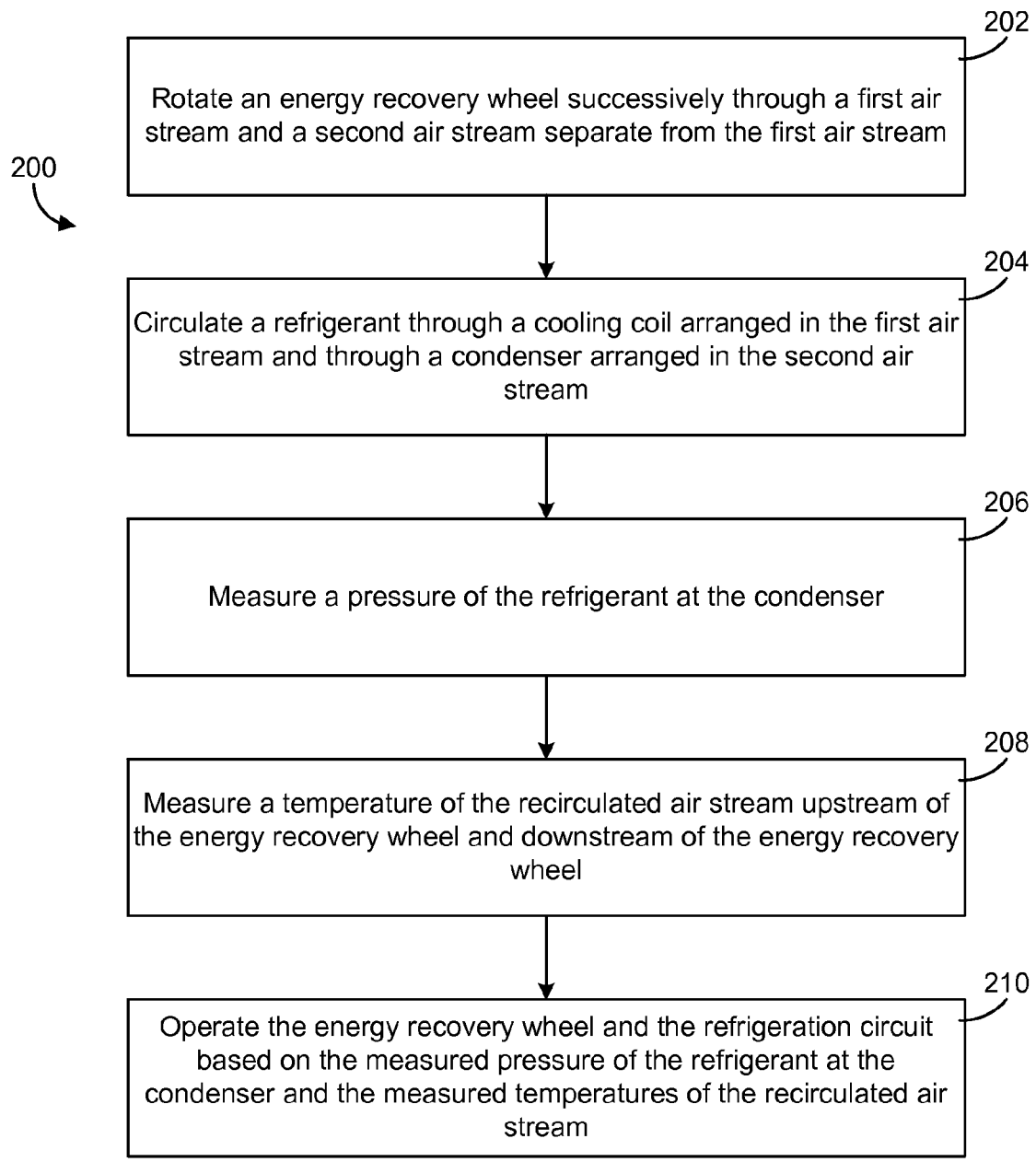
FIG. 7 is a flowchart of a process for air conditioning a building using an energy recovery wheel, according to an exemplary embodiment.

Referring now to FIG. 7, a flowchart of a process 200 for air conditioning a building using an energy recovery wheel is shown, according to an exemplary embodiment. Process 200 may be used to provide air conditioning to data center 10 using energy recovery wheel 40. The air conditioning may be heating, cooling, humidification, dehumidification, air quality modification, or any other type of conditioning. Although process 200 is described with reference to data center 10, process 200 may be used to air condition a wide variety of buildings other than data center 10 (e.g., office buildings, warehouses, residential buildings, etc.).

Process 200 is shown to include rotating an energy recovery wheel successively through a first air stream and a second air stream separate from the first air stream (step 202). In some embodiments, at least one of the first air stream and the second air stream is a recirculated air stream. In some implementations, the first air stream is a recirculated air stream received from an air conditioned space within the data center. The first air stream may be received from the data center as return air and may be delivered to the data center as supply air. In some implementations, the second air stream is an outside air stream received from a space external to the data center (i.e., outside the data center) and exhausted to a space external to the data center.

In some embodiments, the energy recovery wheel is a thermal wheel, a rotary heat exchanger, an enthalpy wheel, a heat wheel, or another similar device. The energy recovery wheel may be the same or similar to energy recovery wheel 40 as described with reference to FIG. 2. For example, the energy recovery wheel may be rotatable about an axis of rotation substantially parallel to a flow direction of the first and/or second air streams. Rotation of the energy recovery wheel may cause a portion of the energy recovery wheel to move successively through the first air stream and the second air stream.

The energy recovery wheel may be configured to transfer heat energy from one of the air streams to the other air stream (e.g., based on which of the first and second air streams has a higher temperature). For example, as the energy recovery wheel rotates, heat may be absorbed by the energy recovery wheel from the warmer of the two air streams (e.g., during a first half of the rotation) and rejected from the energy recovery wheel to the cooler of the two air streams (e.g., during a second half of the rotation). The energy recovery wheel may be rotated (e.g., via an attached motor) at a plurality of rotational speeds. The rotational speed of the energy recovery wheel may be adjusted or controlled to increase or decrease the amount of heat transfer between the first and second air streams. The energy recovery wheel may be configured to transfer sensible heat, latent heat, or a combination thereof.

Still referring to FIG. 7, process 200 is shown to include circulating a refrigerant through a cooling coil arranged in the first air stream and through a condenser arranged in the second air stream (step 204). The cooling coil and the condenser may be part of a refrigeration circuit configured to circulate a refrigerant through both the condenser and the cooling coil (e.g., using a compressor, pump, or other circulation device). In some embodiments, the cooling coil includes a plurality of sections (e.g., sections 42a, 42b, 42c, and 42d) which may be activated or deactivated independently to adjust an amount of cooling provided to the first air stream. In some embodiments, the cooling coil is an evaporator of a vapor compression refrigeration system. In other embodiments, the cooling coil may be any other type of cooling element. The cooling coil may be operated as a supplemental cooling source (i.e., in addition to the energy recovery wheel) or as a primary or sole cooling source (i.e., in place of the energy recovery wheel).

In some embodiments, the heat absorbed from the first air stream by the cooling coil may be transported via the refrigeration circuit to the condenser and subsequently rejected into the second air stream. In some embodiments, the condenser includes a plurality of sections (e.g., sections 44a, 44b) which may be activated or deactivated independently (e.g., using one or more electronic valves) to adjust an amount of heat rejected into the second air stream.

Still referring to FIG. 7, process 200 is shown to include measuring a pressure of the refrigerant at the condenser (step 206) and measuring a temperature of the recirculated air stream upstream of the energy recovery wheel and downstream of the energy recovery wheel (step 208). The pressure of the refrigerant at the condenser may be measured by a pressure sensor located at the condenser (e.g., pressure sensor 46). The pressure of the refrigerant at the condenser may be a refrigerant head pressure. The temperature of the recirculated air stream upstream and downstream of the energy recovery wheel may be measured by one or more temperature sensors (e.g., temperature sensors 98 and 100).

Still referring to FIG. 7, process 200 is shown to include operating the energy recovery wheel and the refrigeration circuit based on the measured pressure of the refrigerant at the condenser and the measured temperatures of the recirculated air stream (step 210). Advantageously, the temperatures of the recirculated air stream upstream and downstream of the energy recovery wheel may be used to determine a temperature differential resulting from the recirculated air stream passing through the energy recovery wheel. The temperature differential can indicate whether it is beneficial to operate the energy recovery wheel, based on the type and amount of air conditioning (e.g., heating, cooling, etc.) required for the recirculated air stream. For example, if the temperature of the recirculated air stream upstream of the energy recovery wheel is lower than the temperature of the recirculated air stream downstream of the energy recovery wheel, it may be determined that the energy recovery wheel is adding heat energy to the recirculated air stream. If it is desired to provide cooling for the recirculated air stream, it may be determined that continued operation of the energy recovery wheel is counterproductive and the energy recovery wheel may be deactivated.

The pressure of the refrigerant at the condenser may be used to determine whether to transition the air conditioning system from the third stage cooling mode (in which the energy recovery wheel is inactive and the refrigeration circuit is active) to the second stage cooling mode (in which both the energy recovery wheel and the refrigeration circuit are active). For example, upon a transition from the second stage cooling mode to the third stage cooling mode, the condenser head pressure may be recorded. In some embodiments, step 210 may include monitoring the refrigerant head pressure at the condenser while operating in the third stage cooling mode. Step 210 may include transitioning from the third stage cooling mode to the second stage cooling mode in response to the refrigerant pressure at the condenser dropping below the pressure value which was recorded upon the transition from the second stage cooling mode to the third stage cooling mode.

Figure 8:
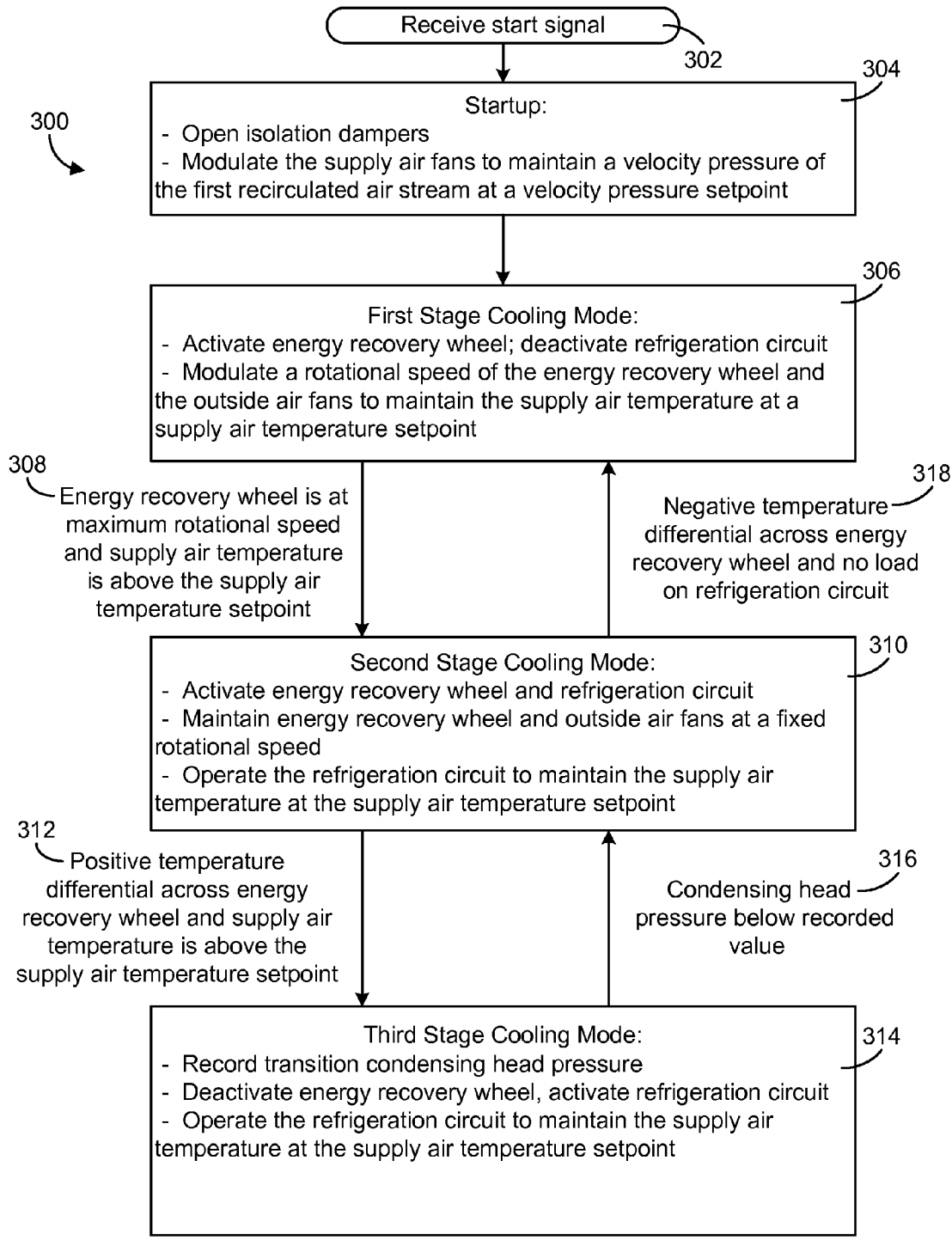
FIG. 8 is a flowchart of a process for controlling an air conditioning system having both an energy recovery wheel and a refrigeration circuit, showing the utilization of the energy recovery wheel and the refrigeration circuit in multiple of cooling modes and the criteria for transitioning between cooling modes, according to an exemplary embodiment.

Referring now to FIG. 8, a flow chart of a process 300 for controlling an air conditioning system for building using an energy recovery wheel is shown, according to an exemplary embodiment. Process 300 may be performed by controller 70 and may be used to control air conditioning system 14 in a plurality of cooling modes (e.g., a first stage cooling mode, a second stage cooling mode, a third stage cooling mode, etc.). Process 300 may also be used to transition air conditioning system 14 between the plurality of cooling modes. Although process 300 is described with respect to a data center, process 300 may also be used to control an air conditioning system or cooling system for other types of buildings (e.g., warehouses, office buildings, residences, etc.).

Process 300 is shown to include receiving a start signal (step 302). In some embodiments, the start signal may be a startup command or other control signal received from a supervisory controller for data center 10 (e.g., a controller for the building automation system controlling data center 10). In other embodiments, the start signal may be provided by a user (e.g., via a local or remote user terminal, via an onboard user interface device, etc.).

Process 300 is shown to further include performing a startup routine (step 304). The startup routine may include opening one or more isolation dampers. Isolation dampers may include a supply air isolation damper (e.g., damper 50), a return air isolation damper (e.g., damper 48), and/or one or more fan isolation dampers (e.g., dampers 52-58). The startup routine may further include modulating one or more supply fans to maintain a velocity pressure of the first recirculated air stream at a velocity pressure setpoint. The one or more supply fans may include fans positioned in line with the first recirculated air stream (e.g., fans 62-64). In some embodiments, the velocity pressure of the first recirculated air stream may be determined by subtracting the static pressure of the first recirculated air stream from the static pressure of the non-moving air outside the first recirculated air stream (e.g., external to air conditioning system 14). In other embodiments, the velocity pressure of the first recirculated air stream may be measured by a differential pressure sensor located within the first recirculated air stream. In some embodiments, step 304 includes increasing or decreasing the rotational speed of the supply fans such that the velocity pressure of the first recirculated air stream is maintained at approximately 0.025 inches w.c. However, this setpoint may be higher or lower in various alternative embodiments.

Still referring to FIG. 8, process 300 is shown to include operating the system in a first stage cooling mode (step 306). In the first stage cooling mode, the energy recovery wheel (e.g., energy recovery wheel 40) may be active and the refrigeration circuit (e.g., cooling coil 42 and condenser 44) may be inactive. In some embodiments, step 306 includes monitoring a temperature of the supply air delivered to the data center (e.g., supply air 34). Step 306 may include modulating a rotational speed of the energy recovery wheel to maintain the temperature of the supply air at a supply air temperature setpoint. Step 306 may further include modulating a rotational speed of the outside air fans (e.g., fans 66-68) to maintain the temperature of the supply air at the supply air temperature setpoint. By modulating the speed of the outside air fans, the amount of heat transfer from the energy recovery wheel to the second air stream may be adjusted.

Still referring to FIG. 8, process 300 is shown to include transitioning from the first stage cooling mode to the second stage cooling mode (step 308). In some embodiments, the rotational speed of the energy recovery wheel and/or the temperature of the supply air is monitored while operating in the first stage cooling mode. Step 308 may be performed in response to the speed of rotation of the energy recovery wheel meeting or exceeding a threshold value for a predetermined period of time. In some embodiments, the threshold value may be a maximum rotational speed for the energy recovery wheel. Accordingly, the transition from the first stage cooling mode to the second stage cooling mode may be performed in response to the energy recovery wheel being operated at a maximum rotational speed for a predetermined period of time.

In some embodiments, step 308 is performed in response to the temperature of the supply air exceeding a supply air temperature setpoint. In some embodiments, step 308 is only performed in response to both the rotational speed of the energy recovery wheel meeting or exceeding the threshold value and the temperature of the supply air exceeding the supply air temperature setpoint. Satisfying both of these conditions may indicate that the supply air requires further cooling and that operation of the energy recovery wheel at maximum capacity is insufficient to provide the cooling required. In some embodiments, step 308 may further require that the outside air fans are operated at a maximum rotational speed.

Still referring to FIG. 8, process 300 is shown to include operating the system in a second stage cooling mode (step 310). In the second stage cooling mode, both the energy recovery wheel (e.g., energy recovery wheel 40) and the refrigeration circuit (e.g., cooling coil 42 and condenser 44) may be active. Step 310 may include maintaining the rotational speed of the energy recovery wheel and/or the outside air fans at a constant rotational speed. In some embodiments, the constant rotational speed is a maximum rotational speed.

In some embodiments, step 310 includes monitoring a temperature of the supply air delivered to data center 10 (e.g., measured by temperature sensor 90). In some embodiments, step 310 includes operating the refrigeration circuit to maintain the temperature of the supply air at a supply air temperature setpoint. Operating the refrigeration circuit may include activating or deactivating one or more sections of the cooling coil (e.g., sections 42a-42d) and one or more sections of the condenser (e.g., sections 44a-44b) to adjust an amount of cooling provided by the refrigeration circuit.

Still referring to FIG. 8, process 300 is shown to include transitioning from the second stage cooling mode to the third stage cooling mode (step 312). Step 312 may be performed in response to a positive temperature differential across the energy recovery wheel and/or a supply air temperature above the supply air temperature setpoint. A positive temperature differential across the energy recovery wheel may be detected by measuring the temperature of the first recirculated air stream upstream of the energy recovery wheel (e.g., using temperature sensor 98) and downstream of the energy recovery wheel (e.g., using temperature sensor 100). A positive temperature differential may be identified when the temperature of the first recirculated air stream downstream of the energy recovery wheel exceeds the temperature of the first recirculated air stream upstream of the energy recovery wheel. A positive temperature differential may indicate that the energy recovery wheel is adding heat energy to the first recirculated air stream.

In some embodiments, step 312 may be performed in response to the temperature of the supply air exceeding a supply air temperature setpoint. In some embodiments, step 312 is only performed in response to both a positive temperature differential across the energy recovery wheel and the temperature of the supply air exceeding the supply air temperature setpoint. Satisfying both of these conditions may indicate that the supply air requires further cooling and that operation of the energy recovery wheel is counterproductive to achieve the cooling required. In some embodiments, step 312 includes recording the condensing head pressure measured by pressure sensor 46 at the time of transition to the third stage cooling mode.

Still referring to FIG. 8, process 300 is shown to include operating the system in a third stage cooling mode (step 314). In some embodiments, step 314 includes recording the condensing head pressure upon entering the third stage cooling mode. In the third stage cooling mode, the energy recovery wheel may be inactive and the refrigeration circuit (e.g., cooling coil 42 and condenser 44) may be active. In some embodiments, step 314 includes monitoring a temperature of the supply air delivered to data center 10 (e.g., measured by temperature sensor 90). Step 314 may include operating the refrigeration circuit to maintain the temperature of the supply air at a supply air temperature setpoint. Operating the refrigeration circuit may include activating or deactivating one or more sections of the cooling coil (e.g., sections 42a-42d) and one or more sections of the condenser (e.g., sections 44a-44b) to adjust an amount of cooling provided by the refrigeration circuit. In some embodiments, step 314 includes monitoring a condensing head pressure of the refrigerant at the condenser (e.g., measured by pressure sensor 46). Step 314 may include modulating a rotational speed of the outside air fans (e.g., fans 66-68) to maintain the condensing head pressure at a condensing head pressure setpoint. For embodiments in which step 314 includes maintaining the condensing head pressure at a condensing head pressure setpoint, various other indicators of a load on the refrigeration circuit may be used to trigger a transition from the third stage cooling mode to the second stage cooling mode (e.g., power consumption, electric current, etc.)

Still referring to FIG. 8, process 300 is shown to include transitioning from the third stage cooling mode to the second stage cooling mode (step 316). In the third stage cooling mode, the condensing head pressure (e.g., measured by pressure sensor 46) may be monitored. Step 316 may be performed in response to the condensing head pressure dropping below the previously-recorded pressure value (e.g., the pressure value recorded upon the transition from the second stage cooling mode to the third stage cooling mode).

Still referring to FIG. 8, process 300 is shown to include transitioning from the second stage cooling mode to the first stage cooling mode (step 318). In some embodiments, step 318 is performed in response to a negative temperature differential across the energy recovery wheel. A negative temperature differential across the energy recovery wheel may be identified when the temperature of the first recirculated air stream upstream of the energy recovery wheel (e.g., measured by temperature sensor 98) is greater than the temperature of the first recirculated air stream downstream of the energy recovery wheel (e.g., measured by temperature sensor 100). A negative temperature differential may indicate that the energy recovery wheel is removing heat energy from the first recirculated air stream. Advantageously, step 318 may be performed without using or considering the temperature of the second air stream.

In some embodiments, step 318 is performed in response to the refrigeration circuit not being used for a predetermined period of time. Not using the refrigeration circuit for the predetermined period of time may indicate that the amount of cooling required can be provided by the energy recovery wheel and that the refrigeration circuit can be deactivated. In some embodiments, step 318 may be performed in response to the temperature of the supply air being less than the supply air temperature setpoint.

Figure 9:
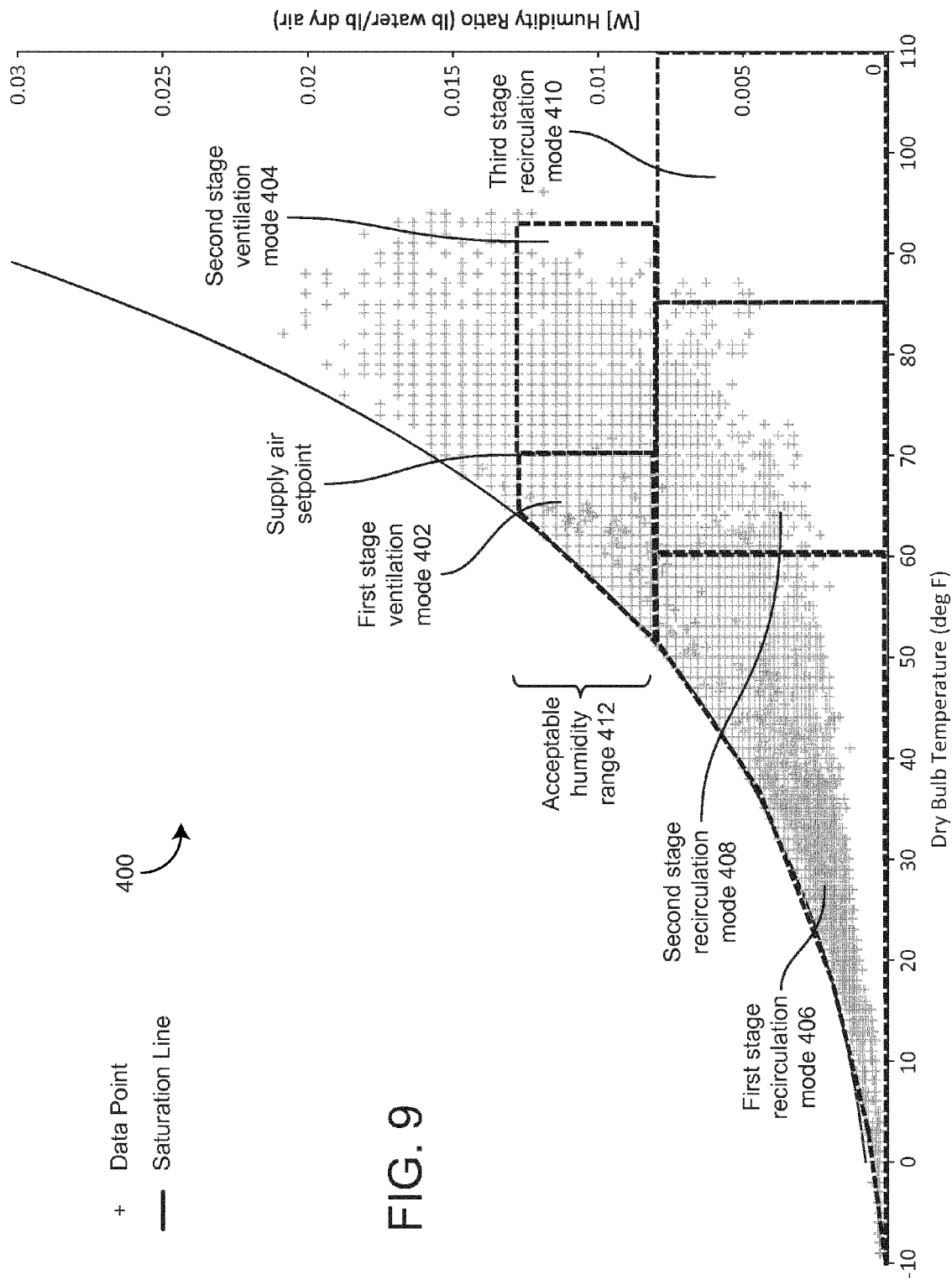
FIG. 9 is a graph demonstrating an alternative set of criteria for transitioning between cooling modes, according to an exemplary embodiment.

Referring now to FIG. 9, a graph 400 illustrating alternative criteria for transitioning between cooling modes is shown, according to an exemplary embodiment. Graph 400 is a two-dimensional graph having a temperature axis and a humidity axis. Graph 400 is shown to include a plurality of data points having a temperature value and a humidity value. The data points represent many different combinations of outside air temperature values and outside air humidity values (e.g., for outside air 32) which may be present at a particular location.

Graph 400 is shown to include several different control zones 402-410. Each of control zones 402-410 is defined by a range of temperature values and a range of humidity values and is represented as a two-dimensional area in graph 400. In some implementations, graph 400 may be used to determine an appropriate cooling mode for a particular combination of outside air temperature and outside air humidity.

Graph 400 is shown to include an acceptable humidity range 412. Acceptable humidity range 412 may be a humidity range which would be acceptable for the air supplied to data center 10 (e.g., as supply air 34). Humidity range 412 may depend on a variety of variables including the intended usage of data center 10 (e.g., office building, residential building, data center, warehouse, etc.) and the humidity requirements for the contents of data center 10 (e.g., human occupants, objects and equipment, computer hardware, etc.).

If the humidity of the outside air is within humidity range 412, it may be desirable to operate air conditioning system 14 in a ventilation mode (as shown in FIG. 5). If the humidity of the outside air is not within humidity range 412, it may be desirable to operate air conditioning system 14 in a recirculation mode (as shown in FIG. 3 and FIGS. 4A-B).

Graph 400 is shown to include a first stage ventilation mode 402 and a second stage ventilation mode 404. In first stage ventilation mode 402 and second stage ventilation mode 404, air conditioning system 14 may be operated as described with reference to FIG. 5. For example, outside air may be delivered into data center 10 and return air may be exhausted as exhaust air. In first stage ventilation mode 402, the temperature of the outside air is within an acceptable range for data center 10 such that cooling is not required. Accordingly, in first stage ventilation mode 402, cooling coil 42 may be inactive. In second stage ventilation mode 404, the temperature of the outside air is higher and therefore cooling may be required to chill the outside air to an acceptable temperature. In second stage ventilation mode 404, cooling coil 42 may be active and used to provide cooling to the outside air before such air is delivered to data center 10.

Graph 400 is shown to further include a first stage recirculation mode 406, a second stage recirculation mode 408, and a third stage recirculation mode 410. Recirculation modes 406-410 may correspond to the first stage cooling mode, second stage cooling mode, and third stage cooling mode described above with reference to FIG. 8. Recirculation modes 406-410 may be implemented using air conditioning system 14 or 14' as described with reference to FIG. 3 and FIGS. 4A-B. For example, in first stage recirculation mode 406, energy recovery wheel 40 may be active and cooling coil 42 may be inactive. In second stage recirculation mode 408, both energy recovery wheel 40 and cooling coil 42 may be active. In third stage recirculation mode 410, energy recovery wheel 40 may be inactive and cooling coil 42 may be active.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products including machine-readable media for carrying or having machine-executable instructions or data structures stored thereon. Such machine-readable media can be any available media that can be accessed by a general purpose or special purpose computer or other machine with a processor. By way of example, such machine-readable media can include RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

It should be noted that references to "front," "back," "rear," "upward," "downward," "inner," "outer," "right," and "left" in this description are merely used to identify the various elements as they are oriented in the FIGURES.

It should further be noted that for purposes of this disclosure, the term "coupled" means the joining of two members directly or indirectly to one another. Such joining may be stationary in nature or moveable in nature and/or such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature.

What is claimed is:

1. A system for air conditioning a building, the system comprising:
    a rotatable energy recovery wheel configured to rotate successively through a first air stream and a second air stream separate from the first air stream, wherein the energy recovery wheel is configured to transfer heat between the first air stream and the second air stream, wherein at least one of the first air stream and the second air stream is a recirculated air stream;
    a refrigeration circuit configured to circulate a refrigerant through a cooling coil arranged in the first air stream and through a condenser arranged in the second air stream, wherein the refrigeration circuit includes a pressure sensor configured to measure a pressure of the refrigerant at the condenser;

a first temperature sensor configured to measure a first temperature of the recirculated air stream upstream of the energy recovery wheel and a second temperature sensor configured to measure a second temperature of the recirculated air stream downstream of the energy recovery wheel; and a controller configured to receive measurements from the pressure sensor and the first and second temperature sensors, wherein the controller is configured to operate the energy recovery wheel and the refrigeration circuit based on the measured pressure of the refrigerant at the condenser and the measured temperatures of the recirculated air stream, wherein operating the energy recovery wheel and the refrigeration circuit comprises:

calculating a temperature differential of the recirculated air stream across the energy recovery wheel by subtracting the first temperature from the second temperature;

activating or deactivating the energy recovery wheel based on the calculated temperature differential of the recirculated air stream across the energy recovery wheel; and activating or deactivating the refrigeration circuit based on the calculated temperature differential of the recirculated air stream across the energy recovery wheel.

2. The system of claim 1, wherein the controller is configured to operate the energy recovery wheel and the refrigeration circuit without measuring an outdoor air temperature.

3. The system of claim 1, wherein the recirculated air stream enters the system as a return air stream from the building and exits the system as a supply air stream to the building, the system further comprising:

a supply air temperature sensor configured to measure a temperature of the supply air stream, wherein operating the energy recovery wheel and the refrigeration circuit comprises operating the energy recovery wheel and the refrigeration circuit to maintain the temperature of the supply air stream at a supply air temperature setpoint.

4. The system of claim 1, wherein operating the energy recovery wheel and the refrigeration circuit comprises operating in a first stage cooling mode in which the energy recovery wheel is active and the refrigeration circuit is inactive, wherein operating in the first stage cooling mode includes modulating a speed of rotation of the energy recovery wheel to maintain a temperature of a supply air stream at a supply air temperature setpoint.

5. The system of claim 1, further comprising:

one or more devices for controlling a flow rate of the first air stream or the second air stream, wherein the controller is configured to modulate the flow rate of the first air stream or the second air stream using the one or more devices to maintain a temperature of a supply air stream at a supply air temperature setpoint.

6. The system of claim 1, wherein operating the energy recovery wheel and the refrigeration circuit comprises operating in a second stage cooling mode in which both the energy recovery wheel and the refrigeration circuit are active, wherein operating in the second stage cooling mode includes operating the refrigeration circuit to maintain a temperature of a supply air stream at a supply air temperature setpoint.

7. The system of claim 6, wherein the controller is configured to cause the energy recovery wheel to rotate at a constant rotational speed in the second stage cooling mode.

8. The system of claim 1, wherein operating the energy recovery wheel and the refrigeration circuit comprises operating in a third stage cooling mode in which the energy recovery wheel is inactive and the refrigeration circuit is active, wherein operating the system in the third stage cooling mode includes operating the refrigeration circuit to maintain a temperature of a supply air stream at a supply air temperature setpoint.

9. The system of claim 1, wherein operating the energy recovery wheel and the refrigeration circuit comprises operating in a first stage cooling mode in which the energy recovery wheel is active and the refrigeration circuit is inactive and in a second stage cooling mode in which both the energy recovery wheel and the refrigeration circuit are active, wherein the controller is configured to monitor a speed of rotation of the energy recovery wheel in the first stage cooling mode, wherein the controller is configured to transition from the first stage cooling mode to the second stage cooling mode in response to at least one of:

the speed of rotation of the energy recovery wheel exceeding a threshold value, and a temperature of a supply air stream exceeding a supply air temperature setpoint.

10. The system of claim 1, wherein operating the energy recovery wheel and the refrigeration circuit comprises operating in a second stage cooling mode in which both the energy recovery wheel and the refrigeration circuit are active and in a third stage cooling mode in which the energy recovery wheel is inactive and the refrigeration circuit is active, wherein the controller is configured to transition from the second stage cooling mode to the third stage cooling mode in response to the second temperature of the recirculated air stream downstream of the energy recovery wheel being greater than the first temperature of the recirculated air stream upstream of the energy recovery wheel.

11. The system of claim 1, wherein operating the energy recovery wheel and the refrigeration circuit comprises operating in a second stage cooling mode in which both the energy recovery wheel and the refrigeration circuit are active and in a third stage cooling mode in which the energy recovery wheel is inactive and the refrigeration circuit is active, wherein the controller is configured to use the pressure sensor to measure and record a transition pressure of the refrigerant at the condenser upon a transition from the second stage cooling mode to the third stage cooling mode, wherein the controller is configured to transition from the third stage cooling mode to the second stage cooling mode in response to the pressure of the refrigerant at the condenser dropping below the measured and recorded transition pressure.

12. The system of claim 1, wherein operating the energy recovery wheel and the refrigeration circuit comprises operating in a first stage cooling mode in which the energy recovery wheel is active and the refrigeration circuit is inactive and in a second stage cooling mode in which both the energy recovery wheel and the refrigeration circuit are active, wherein the controller is configured to transition from the second stage cooling mode to the first stage cooling mode in response to at least one of:
the second temperature of the recirculated air stream downstream of the energy recovery wheel being less than the first temperature of the recirculated air stream upstream of the energy recovery wheel, and
the refrigeration circuit being not utilized for a predetermined period of time.

13. The system of claim 1, further comprising:
a flow control unit having a first fluid inlet, a first fluid outlet, a second fluid inlet, and a second fluid outlet; and
one or more flow control devices configured to transition the flow control unit between a recirculation mode and a ventilation mode;
wherein, in the recirculation mode, the first fluid inlet is fluidly connected with the first fluid outlet and the second fluid inlet is fluidly connected with the second fluid outlet; and
wherein, in the ventilation mode, the first fluid inlet is fluidly connected with the second fluid outlet and the second fluid inlet is fluidly connected with the first fluid outlet.

14. A method for air conditioning a building, the method comprising:
rotating an energy recovery wheel successively through a first air stream and a second air stream separate from the first air stream, wherein at least one of the first air stream and the second air stream is a recirculated air stream;
circulating a refrigerant through a refrigeration circuit comprising a cooling coil arranged in the first air stream and a condenser arranged in the second air stream;
measuring a pressure of the refrigerant at the condenser;
measuring a first temperature of the recirculated air stream upstream of the energy recovery wheel and a second temperature of the recirculated air stream downstream of the energy recovery wheel;
operating the energy recovery wheel and the refrigeration circuit based on the measured pressure of the refrigerant at the condenser and the measured temperatures of the recirculated air stream, wherein operating the energy recovery wheel and the refrigeration circuit comprises:
calculating a temperature differential of the recirculated air stream across the energy recovery wheel by subtracting the first temperature from the second temperature;
activating or deactivating the energy recovery wheel based on the calculated temperature differential of the recirculated air stream across the energy recovery wheel; and
activating or deactivating the refrigeration circuit based on the calculated temperature differential of the recirculated air stream across the energy recovery wheel.

15. The method of claim 14, wherein operating the energy recovery wheel and the refrigeration circuit is not based on a measured outdoor air temperature.

16. The method of claim 14, further comprising:
receiving the recirculated air stream as a return air stream from the building;
delivering the recirculated air stream as a supply air stream to the building;
measuring a temperature of the supply air stream,
wherein operating the energy recovery wheel and the refrigeration circuit comprises operating the energy recovery wheel and the refrigeration circuit to maintain the temperature of the supply air stream at a supply air temperature setpoint.

17. The method of claim 14, wherein operating the energy recovery wheel and the refrigeration circuit comprises:
operating the energy recovery wheel and the refrigeration circuit in a first stage cooling mode in which the energy recovery wheel is active and the refrigeration circuit is inactive,
wherein operating the energy recovery wheel and the refrigeration circuit in the first stage cooling mode includes modulating a speed of rotation of the energy recovery wheel to maintain a temperature of a supply air stream at a supply air temperature setpoint.

18. The method of claim 14, further comprising:
modulating a flow rate of the first air stream or the second air stream to maintain a temperature of a supply air stream at a supply air temperature setpoint.

19. The method of claim 14, wherein operating the energy recovery wheel and the refrigeration circuit comprises:
operating the energy recovery wheel and the refrigeration circuit in a second stage cooling mode in which both the energy recovery wheel and the refrigeration circuit are active,
wherein operating the energy recovery wheel and the refrigeration circuit in the second stage cooling mode includes operating the refrigeration circuit to maintain a temperature of a supply air stream at a supply air temperature setpoint.

20. The method of claim 14, wherein operating the energy recovery wheel and the refrigeration circuit comprises operating the energy recovery wheel and the refrigeration circuit in a third stage cooling mode in which the energy recovery wheel is inactive and the refrigeration circuit is active,
wherein operating the energy recovery wheel and the refrigeration circuit in the third stage cooling mode includes operating the refrigeration circuit to maintain a temperature of a supply air stream at a supply air temperature setpoint.

* * * * *